US011350021B2

(12) United States Patent
Mai et al.

(10) Patent No.: US 11,350,021 B2
(45) Date of Patent: May 31, 2022

(54) CAMERA MODULE COMPRISING INFRARED FILTER AND ELECTRONIC DEVICE COMPRISING SAME

(71) Applicant: Samsung Electronics Co., Ltd., Suwon-si (KR)

(72) Inventors: The Anh Mai, Bac Ninh Province (VN); Bongjin Chu, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/267,001

(22) PCT Filed: Aug. 7, 2019

(86) PCT No.: PCT/KR2019/009921
§ 371 (c)(1),
(2) Date: Feb. 8, 2021

(87) PCT Pub. No.: WO2020/032596
PCT Pub. Date: Feb. 13, 2020

(65) Prior Publication Data
US 2021/0234999 A1    Jul. 29, 2021

(30) Foreign Application Priority Data
Aug. 8, 2018    (KR) .................. 10-2018-0092715

(51) Int. Cl.
*H04N 5/225*     (2006.01)
*G03B 17/12*     (2021.01)
(Continued)

(52) U.S. Cl.
CPC ........... *H04N 5/2254* (2013.01); *G03B 17/12* (2013.01); *H04N 5/2252* (2013.01);
(Continued)

(58) Field of Classification Search
CPC .................................................. H04N 5/2254
See application file for complete search history.

(56) References Cited

U.S. PATENT DOCUMENTS

| 10,033,934 | B2 * | 7/2018 | Wang | H04N 5/2254 |
| 2002/0171031 | A1 * | 11/2002 | Kim | H01L 27/14618 |
| | | | | 250/208.1 |

(Continued)

FOREIGN PATENT DOCUMENTS

| JP | 2007-086598 A | 4/2007 |
| JP | 2007-121853 A | 5/2007 |

(Continued)

OTHER PUBLICATIONS

International Search Report dated Dec. 4, 2019 in connection with International Patent Application No. PCT/KR2019/009921, 2 pages.

(Continued)

*Primary Examiner* — Gary C Vieaux

(57) ABSTRACT

A camera module according to one embodiment comprises: a housing including a through hole and a lens assembly disposed in the through hole toward a first surface on which light is incident; an infrared filter attached to a second surface of the housing, positioned on the opposite side of the first surface to shield inflow of infrared rays from the incident light; and an image sensor for recognizing the light passing through the infrared filter, wherein the infrared filter comprises: an effective filtering region for transmitting visible light; an attachment region attached by an adhesive applied to the second surface of the housing, for forming the exterior of the infrared filter; and a masking region formed between the attachment region and the effective filtering region, wherein the effective filtering region is formed to protrude from a vertex region and overlaps with a region in which the image sensor is positioned and the attachment region is formed as an area capable of securing adhesion (Continued)

with the second surface and forms chamfered edges according to a shape of the masking region such that ultraviolet light can be transmitted to cure the adhesive.

20 Claims, 43 Drawing Sheets

(51) Int. Cl.
  *H05K 1/18* (2006.01)
  *G03B 30/00* (2021.01)
(52) U.S. Cl.
  CPC .......... *H04N 5/2253* (2013.01); *H05K 1/189* (2013.01); *G03B 30/00* (2021.01); *H05K 2201/09036* (2013.01)

(56) References Cited

U.S. PATENT DOCUMENTS

| | | | |
|---|---|---|---|
| 2004/0104387 A1* | 6/2004 | Mogamiya | H01L 27/14618 257/40 |
| 2006/0243884 A1 | 11/2006 | Onodera et al. | |
| 2013/0077156 A1 | 3/2013 | Karasawa | |
| 2014/0293063 A1 | 10/2014 | Lee et al. | |
| 2015/0123857 A1* | 5/2015 | Park | H01Q 21/30 343/702 |
| 2015/0138369 A1 | 5/2015 | Takakuwa et al. | |
| 2016/0165108 A1* | 6/2016 | Jang | G02B 7/08 348/374 |
| 2016/0241763 A1* | 8/2016 | Jung | H04N 5/2254 |
| 2017/0115463 A1 | 4/2017 | Osaka et al. | |
| 2017/0357144 A1* | 12/2017 | Kim | G03B 9/06 |

FOREIGN PATENT DOCUMENTS

| | | |
|---|---|---|
| JP | 2012-014133 A | 1/2012 |
| JP | 2017-003888 A | 1/2017 |
| KR | 10-2011-0011264 A | 2/2011 |
| KR | 10-2013-0013325 A | 2/2013 |
| KR | 10-2015-0058950 A | 5/2015 |
| KR | 10-2016-0069714 A | 6/2016 |
| KR | 10-2017-0023884 A | 3/2017 |

OTHER PUBLICATIONS

Written Opinion of the International Searching Authority dated Dec. 4, 2019 in connection with International Patent Application No. PCT/KR2019/009921, 5 pages.

European Patent Office, "Supplementary European Search Report" dated May 31, 2021, in connection with European Patent Application No. EP19846204.6, 7 pages.

* cited by examiner

CAMERA MODULE COMPRISING INFRARED FILTER AND ELECTRONIC DEVICE COMPRISING SAME

CROSS-REFERENCE TO RELATED APPLICATIONS

This application is a 371 of International Application No. PCT/KR2019/009921 filed on Aug. 7, 2019, which claims priority to Korean Patent Application No. 10-2018-0092715 filed on Aug. 8, 2018, the disclosures of which are herein incorporated by reference in their entirety.

BACKGROUND

1. Field

Various embodiments relate to a camera module including an infrared (IR) filter and an electronic device including the same.

2. Description of Related Art

A mobile electronic device, such as a portable communication terminal or a laptop, is capable of transmitting not only text-formed data, but also image data including multimedia such as images and videos. In order to transmit image data, a mobile electronic device may include a camera module.

The camera module may include a lens assembly in which a plurality of lenses are stacked, and light passing through the lens assembly may be recognized by an image sensor and processed by a processor of the electronic device. The processed data may be stored in a memory. Since an image or image clarity can be determined by the light recognized by the image sensor, it is possible to obtain an image with high clarity by preventing reflected or scattered light from being transmitted to the image sensor.

Light incident from a lens may be reflected by a gold wire around an image sensor, causing a flare phenomenon or a blurring phenomenon. Thus, a method for solving this problem is needed.

According to various embodiments of the disclosure, it is possible to prevent reflection of light incident on a light reception surface of an image sensor, and to guide inflow of light required for image capture by setting an effective sensing region, an attachment region, and a masking region of an infrared filter attached to a camera module.

SUMMARY

A camera module according to various embodiments may include: a housing including a through hole and a lens assembly disposed in the through hole to face a first surface on which light is incident; an infrared filter attached to a second surface of the housing, positioned on a side opposite to the first surface; an image sensor configured to recognize the light passing through the infrared filter; and a printed circuit board coupled to the housing. The infrared filter may include an effective filtering region configured to transmit visible light, and a masking region surrounding the effective filtering region and having chamfered edges, the infrared filter having a shape corresponding to a shape of the chamfered edges of the masking region.

According to various embodiments, an electronic device, which includes an inner space, may include a main printed circuit board disposed in the inner space, and a camera module connected to the main printed circuit board. The camera module may include: a housing disposed in the inner space and including a first opening, a second opening formed in a surface opposite a surface in which the first opening is disposed, and an accommodation portion formed as a hole penetrating the first and second openings; a lens assembly disposed in the accommodation portion and exposed to an outside of the electronic device through the first opening such that external light is incident on the lens assembly; an infrared filter attached to a seating groove formed in the surface in which the second opening is formed; an image sensor configured to recognize light passing through the infrared filter and having a rectangular shape; and a printed circuit board on which the image sensor is mounted, the printed circuit being coupled to the housing. The infrared filter may include an effective filtering region configured to transmit visible light, and a masking region surrounding the effective filtering region and having chamfered edges. The infrared filter may have a shape corresponding to a shape of the chamfered edges of the masking region.

According to various embodiments, the camera module is capable of preventing light passing through the lens from being incident on a region other than the light reception surface of the image sensor, thereby preventing the light from being reflected from a gold wire or a lens assembly so that a flare phenomenon or a blurring phenomenon can be prevented.

DETAILED DESCRIPTION

Figure 1:
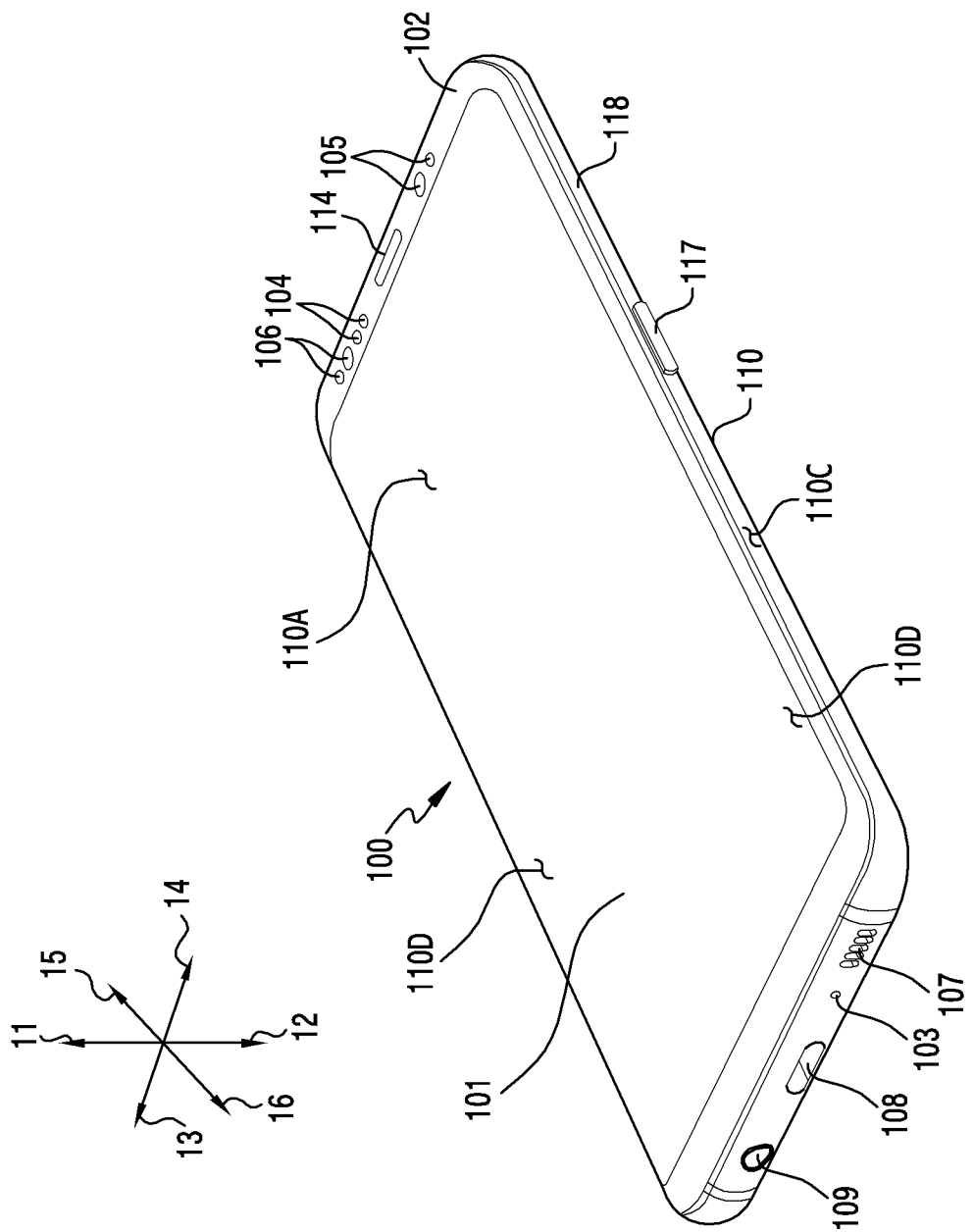
FIG. 1 is a front perspective view of a mobile electronic device according to an embodiment.
Figure 2:
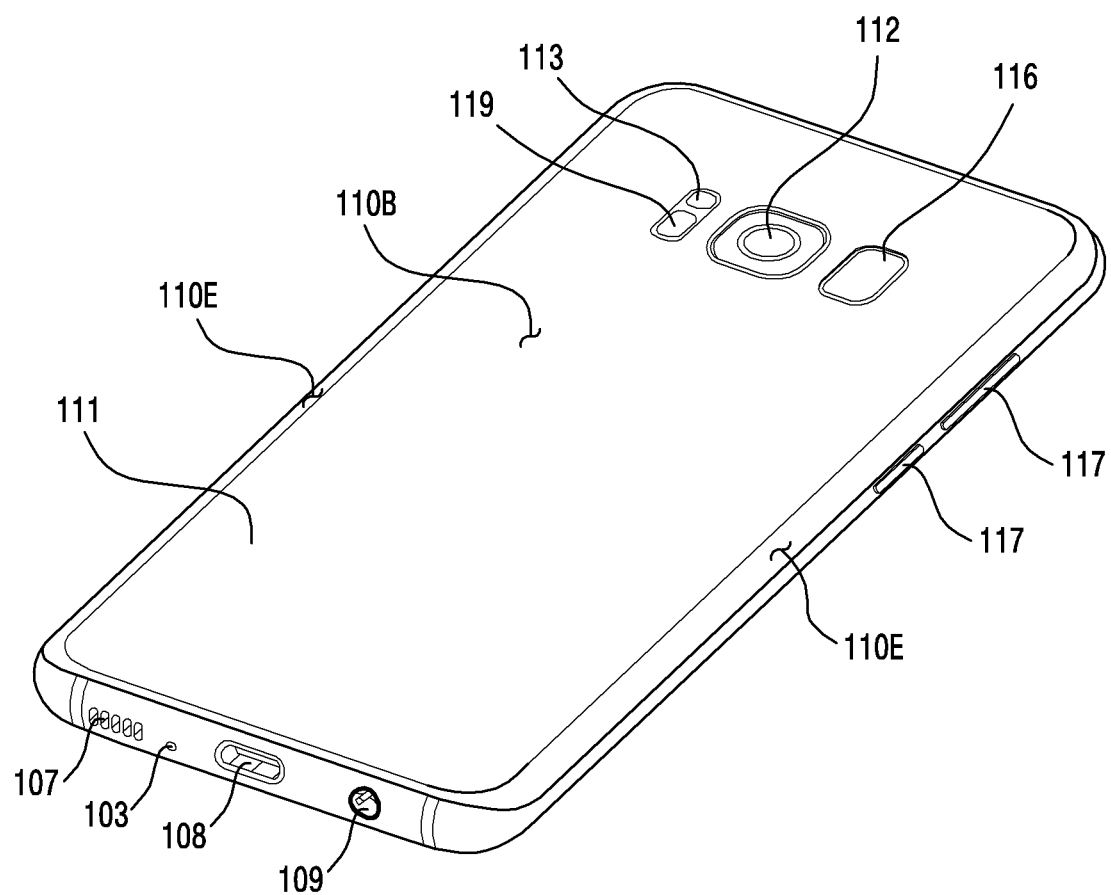
FIG. 2 is a rear perspective view of the electronic device of FIG. 1.

FIG. 1 is a perspective view illustrating the front face of a mobile electronic device according to an embodiment. FIG. 2 is a perspective view illustrating the rear face of the electronic device of FIG. 1.

Referring to FIGS. 1 and 2, an electronic device 100 according to an embodiment may include: a housing 110 including a first face (or a front face) 110A, a second face (or a rear face) 110B, and a side face 110C surrounding a space between the first face 110A and the second face 110B. In another embodiment (not illustrated), the term, housing, may refer to a structure forming some of the first face 110A, the second face 110B, and the side face 110C of FIG. 1. According to an embodiment, at least a portion of the first face 110A may be formed by a substantially transparent front plate 102 (e.g., a glass plate or a polymer plate including various coating layers). The second face 110B may be formed of a substantially opaque rear plate 111. The rear plate 111 may be formed of, for example, coated or colored glass, ceramic, a polymer, or a metal (e.g., aluminum, stainless steel (STS), or magnesium), or a combination of two or more of these materials. The side faces 110C may be formed by a side bezel structure (or a "side member") 118 coupled to the front plate 102 and the rear plate 111 and including a metal and/or a polymer. In some embodiments, the rear plate 111 and the side bezel structure 118 may be integrally formed, and may include the same material (e.g., a metal material such as aluminum).

In the illustrated embodiment, the front plate 102 may include two first areas 110D, which are bent from the first face 110A toward the rear plate 111 and extend seamlessly, at the long opposite side edges thereof. In the illustrated embodiment (see FIG. 2), the rear plate 111 may include two second areas 110E, which are bent from the second face 110B toward the front plate 102 and extend seamlessly, at the long opposite side edges thereof. In some embodiments, the front plate 102 (or the rear plate 111) may include only one of the first areas 110D (or the second areas 110E). In another embodiment, some of the first areas 110D and the second areas 110E may not be included. In the above embodiments, when viewed from a side of the electronic device 100, the side bezel structure 118 may have a first thickness (or width) on the side faces, which do not include the first areas 110D or the second areas 110E, and may have a second thickness (or width), which is thinner than the first thickness, on the side faces which include the first areas 110D or the second areas 110E.

According to an embodiment, the electronic device 100 may include at least one of a display 101, audio modules 103, 107, and 114, sensor modules 104, 116, and 119, camera modules 105, 112, and 113, key input devices 117, light-emitting elements 106, and connector holes 108 and 109. In some embodiments, in the electronic device 100, at least one of the components ((e.g., the key input devices 117 or the light-emitting element 106) may be omitted, or other components may be additionally included.

The display 101 may be exposed through, for example, a large portion of the front plate 102. In some embodiments, at least a part of the display 101 may be exposed through the front plate 102 forming the first face 110A and the first areas 110D of the side faces 110C. In some embodiments, the edges of the display 101 may be formed to be substantially the same as the contour shape of the front plate 102 adjacent thereto. In another embodiment (not illustrated), the distance between the outer contour of the display 101 and the outer contour of the front plate 102 may be substantially constant in order to enlarge the exposed area of the display 101.

In another embodiment (not illustrated), a recess or an opening is formed in a part of a screen display area of the display 101, and at least one of an audio module 114, a module 104, a camera module 105, and a light-emitting element 106 may be aligned with the recess or the opening. In another embodiment (not illustrated), at least one of the audio module 114, the sensor module 104, the camera module 105, the fingerprint sensor 116, and the light-emitting element 106 may be included in the rear face of the screen display area of the display 101. In another embodiment (not illustrated), the display 101 may be coupled to or disposed adjacent to a touch-sensing circuit, a pressure sensor capable of measuring the intensity of the touch (pressure), and/or a digitizer that detects a stylus pen. In some embodiments, at least some of the sensor modules 104 and 119 and/or at least some of the key input devices 117 may be disposed in the first areas 110D and/or the second areas 110E.

The audio modules 103, 107, and 114 may include a microphone hole 103 and speaker holes 107 and 114. The microphone hole 103 may include a microphone disposed therein so as to acquire external sound, and in some embodiments, multiple microphones may be disposed therein so as to detect the direction of sound. The speaker holes 107 and 114 may include an external speaker hole 107 and a phone call receiver hole 114. In some embodiments, the speaker holes 107 and 114 and the microphone hole 103 may be implemented as a single hole, or a speaker may be included without the speaker holes 107 and 114 (e.g., a piezo speaker).

The sensor modules 104, 116, and 119 may generate electrical signals or data values corresponding to an internal operating state or an external environmental condition of the electronic device 100. The sensor modules 104, 116, and 119 may include, for example, a first sensor module 104 (e.g., a proximity sensor) and/or a second sensor module (not illustrated) (e.g., a fingerprint sensor) disposed on the first face 110A of the housing 110, and/or a third sensor module 119 (e.g., an HRM sensor) and/or a fourth sensor module 116 (e.g., a fingerprint sensor) disposed on the second face 110B of the housing 110. The fingerprint sensor may be disposed not only on the first face 110A of the housing 110 (e.g., the display 101), but also on the second face 110B. The electronic device 100 may further include a sensor module (not illustrated). The sensor module, for example, may comprise at least one of a gesture sensor, a gyro sensor, an air pressure sensor, a magnetic sensor, an acceleration sensor, a grip sensor, a color sensor, an infrared (IR) sensor, a biosensor, a temperature sensor, a humidity sensor, or an illuminance sensor.

The camera modules 105, 112, and 113 may include a first camera device 105 disposed on the first face 110A of the electronic device 100 and a second camera device 112 disposed on the second face 110B, and/or a flash 113. The camera devices 105 and 112 may include one or more lenses, an image sensor, and/or an image signal processor. The flash 113 may include, for example, a light-emitting diode or a xenon lamp. In some embodiments, two or more lenses (e.g., an infrared camera lens, a wide-angle lens, and a telephoto lens) and image sensors may be disposed on one face of the electronic device 100.

The key input devices 117 may be disposed on the side face 110C of the housing 110. In another embodiment, the electronic device 100 may not include some or all of the above-mentioned key input devices 117, and a key input device 117, which is not included therein, may be implemented in another form such as a soft key on the display 101. In some embodiments, the key input devices 117 may include a sensor module 116 disposed on the second face 110B of the housing 110.

The light-emitting element 106 may be disposed, for example, on the first face 110A of the housing 110. The light-emitting element 106 may provide, for example, the status information of the electronic device 100 in an optical form. In another embodiment, the light-emitting element 106 may provide a light source that is interlocked with, for example, the operation of the camera module 105. The light-emitting element 106 may include, for example, an LED, an IR LED, and a xenon lamp.

The connector holes 108 and 109 may include a first connector hole 108 capable of accommodating a connector (e.g., a USB connector) for transmitting and receiving power and/or data to and from an external electronic device, and/or a second connector hole 109 capable of receiving a connector (e.g., an earphone jack) for transmitting and receiving an audio signal to and from an external electronic device.

Figure 3:
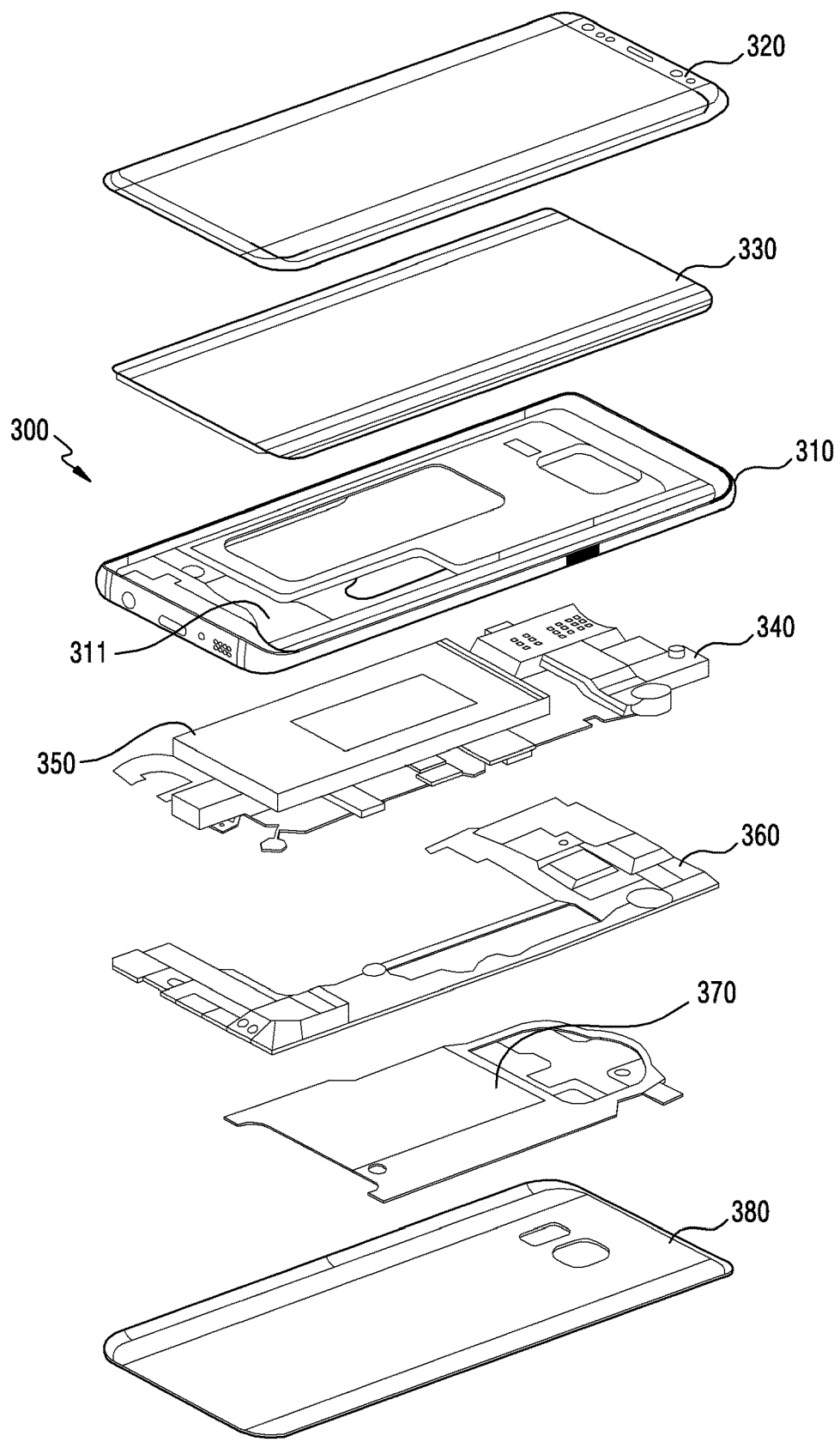
FIG. 3 is an exploded perspective view of the electronic device of FIG. 1.

FIG. 3 is an exploded perspective view illustrating the internal configuration of the electronic device of FIG. 1.

Referring to FIG. 3, an electronic device 300 may include a side bezel structure 310, a first support member 311 (e.g., a bracket), a front plate 320, a display 330, a printed circuit board 340, a battery 350, a second support member 360 (e.g., a rear case), an antenna 370, and a rear plate 380. In some embodiments, at least one of the components (e.g., the first support member 311 or the second support member 360) may be omitted from the electronic device 300, or the electronic device 300 may additionally include other components. At least one of the components of the electronic device 300 may be the same as or similar to at least one of the components of the electronic device 100 of FIG. 1 or 2, and a redundant description thereof is omitted below.

The first support member 311 may be disposed inside the electronic device 300 and connected to the side bezel structure 310 or may be formed integrally with the side bezel structure 310. The first support member 311 may be formed of, for example, a metal material and/or a non-metal (e.g., polymer) material. The display 330 may be coupled to one face of the first support member 311, and the printed circuit board 340 may be coupled to the other face of the first support member 332. On the printed circuit board 340, a processor, a memory, and/or an interface may be mounted. The processor may include at least one of, for example, a central processing unit, an application processor, a graphic processor, an image signal processor, a sensor hub processor, or a communication processor.

The memory may include, for example, a volatile memory or a nonvolatile memory.

The interface may include, for example, a high definition multimedia interface (HDMI), a universal serial bus (USB) interface, an SD card interface, and/or an audio interface. The interface may electrically or physically connect, for example, the electronic device 300 to an external electronic device, and may include a USB connector, an SD card/an MMC connector, or an audio connector.

The battery 350 is a device for supplying power to at least one component of the electronic device 300, and may include, for example, a non-rechargeable primary battery, a rechargeable secondary battery, or a fuel cell. At least a part of the battery 350 may be disposed to be substantially flush with, for example, the printed circuit board 340. The battery 350 may be integrally disposed within the electronic device 300, or may be mounted to be detachable from the electronic device 300.

The antenna 370 may be disposed between the rear plate 380 and the display 350. The antenna 370 may include, for example, a near-field Communication (NFC) antenna, a wireless charging antenna, and/or a magnetic secure transmission (MST) antenna. The antenna 370 may perform short-range communication with, for example, an external device, or may transmit/receive power required for charging in a wireless manner to/from the external device. In another embodiment, an antenna structure may be formed by the side bezel structure 310, a part of the first support member 311, or a combination thereof.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., a program) including one or more instructions that are stored in a storage medium (e.g., internal memory (not illustrated) or external memory (not illustrated)) that is readable by a machine (e.g., the electronic device 100). For example, a processor of the machine (e.g., the electronic device 100) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 4A:
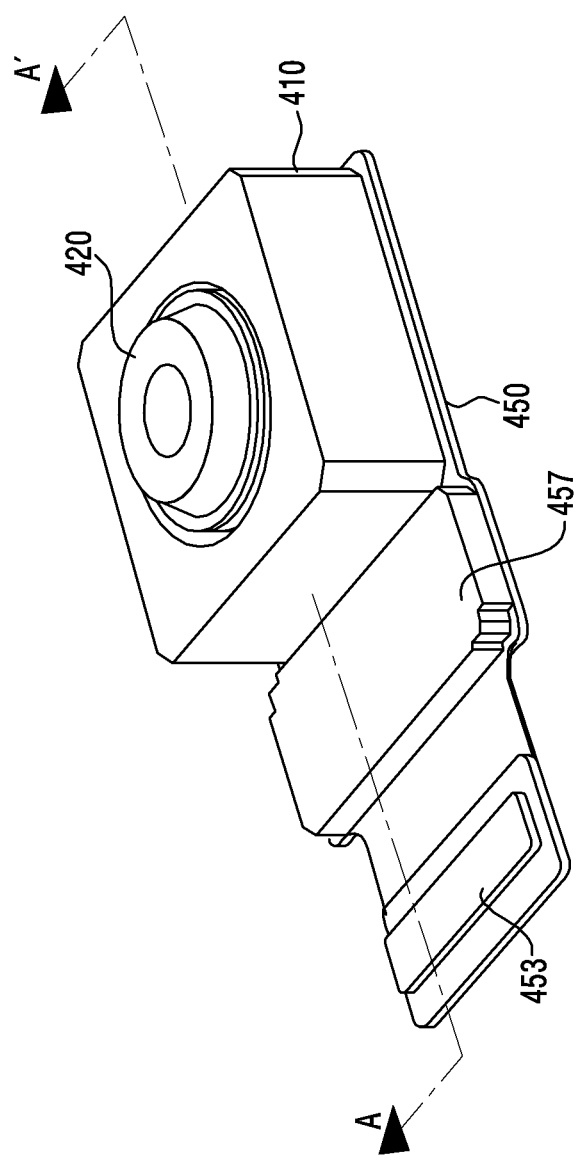
FIG. 4A is a perspective view of a camera module according to an embodiment.
Figure 4B:
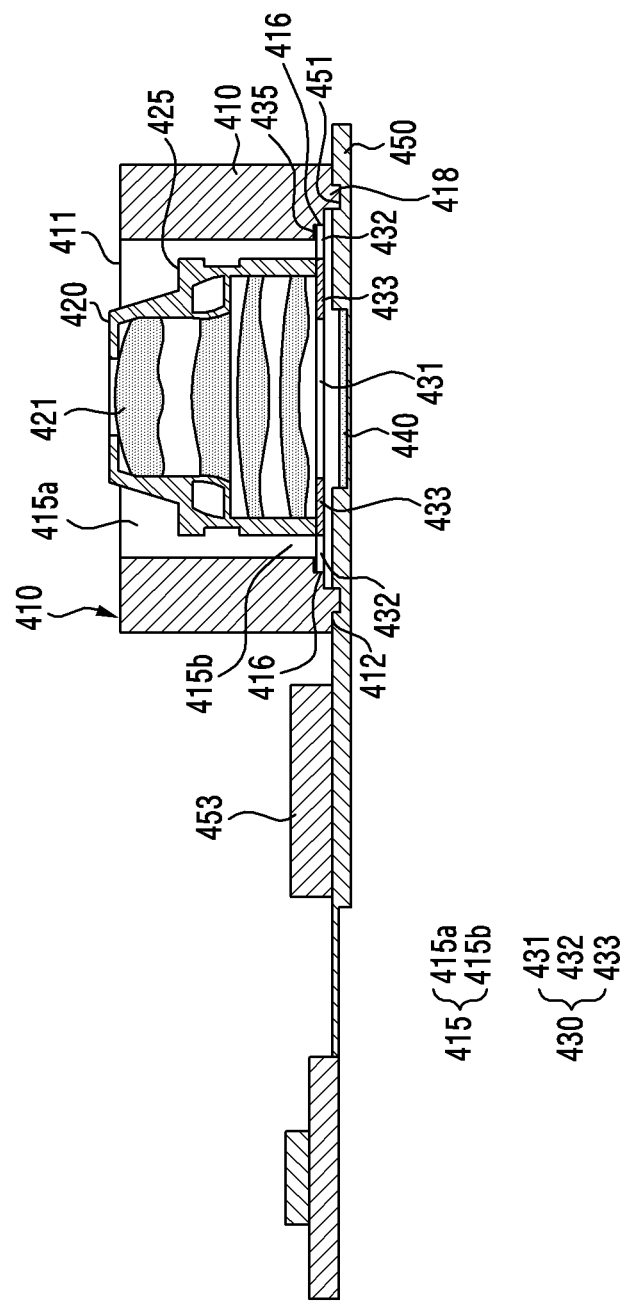
FIG. 4B is a cross-sectional view of the camera module of FIG. 4A.

FIG. 4A is a perspective view of a camera module according to an embodiment, and FIG. 4B is a cross-sectional view of the camera module of FIG. 4A.

Referring to FIGS. 4A and 4B, the camera module 400 may include a housing 410, a lens assembly 420, an infrared filter 430, an image sensor 440, and a printed circuit board 450.

According to an embodiment, the housing 410 may include a first opening 415a in a first surface 411 exposed to the outside and a second opening 415b in a second surface 412 facing a printed circuit board 450. The first opening 415a and the second opening 415b may be connected to form a through hole in an inner space 415 so as to accommodate the lens assembly 420. According to an embodiment, the second surface 412 of the housing 410 may include a step so as to form a groove corresponding to the shape of the infrared filter 430 such that the infrared filter 430 can be seated in the groove. The infrared filter 430 may be seated in a groove formed in the second surface 412 of the housing 410.

According to an embodiment, the lens assembly 420 may expose a portion of the lens 421 through the first opening 415a in the housing 410. The lens assembly 420 may include a lens barrel 425 and lenses 421. The lens barrel 425 may define the inner space 415 such that at least one lens 421 for imaging a subject can be accommodated therein. The inner space 415 may be formed in a shape corresponding to the lens barrel 425. According to an embodiment, the lens barrel 425 may be formed in a cylindrical shape. An optical axis is formed in the center of the lens barrel 425 so as to form a focus of light introduced from the outside. The lens barrel 425 may include a lens 421 therein, and a portion of the lens barrel 425 may be opened such that the lens 421 can be exposed to the outside. A plurality of lenses 421 may be stacked such that the optical axes thereof are aligned.

The lens barrel 425 may be coupled with the housing 410, and the lens barrel 425 may move in the optical axis direction for an auto focus (AF) function. For an optical image stabilization (OIS), the lens barrel 425 is also finely movable in a plane direction perpendicular to the optical axis, and thus the side surface of the lens barrel 425 and the inner wall of the housing 410 can be spaced apart from each other.

According to an embodiment, the infrared filter 430 may include an effective filtering region 431, an attachment region 432, and a masking region 433. The effective filtering region 431 may pass visible rays and block infrared rays from light introduced through the lens 421. The attachment region 432 may be applied with an adhesive 435 or may include a coupling structure such that the infrared filter 430 can be attached to the housing 410. The attachment region 432 may be formed of a transparent material in order to cure the adhesive 435 applied between a seating portion 416 of the housing 410 and the attachment region 432 by ultraviolet rays. According to an embodiment, in order to attach the infrared filter 430 and the housing 410 by curing the applied adhesive 435 by ultraviolet rays, the attachment region 432 may be formed to be larger than the application area of the adhesive 435. The attachment region 432 may be formed to secure a minimum area for securing bonding strength for bonding the infrared filter 430 using the applied adhesive 435.

According to an embodiment, the masking region 433 may be formed between the effective filtering region 431 and the attachment region 432. The masking region 433 may be a black masking region for blocking reflected light introduced into the image sensor 440. The masking region 433 may be formed around the effective filtering region 431 in the form of surrounding the effective filtering region 431 through which light passes.

According to an embodiment, the image sensor 440 may be disposed under the infrared filter 430. The image sensor 440 may generate an image signal by condensing light incident through the lens 421. The image sensor 440 may be made of a complementary metal-oxide semiconductor (CMOS) sensor or a charge-coupled device (CCD) sensor. The image sensor 440 may include a light reception surface facing the lens 421 in order to recognize an image. The image sensor 440 may be mounted on the printed circuit board 450. The image sensor 440 may be electrically connected to the printed circuit board 450 via a bonding wire.

According to an embodiment, the printed circuit board 450 may be disposed under the housing 410, and may include a coupling groove 458 in a portion that comes into contact with the housing 410. The second surface 412 of the housing 410 may include a protrusion 418, and the protrusion 418 may be inserted into the coupling groove 458 so as to couple the housing 410 and the printed circuit board 450. The printed circuit board 450 may have a seating groove formed in a direction away from the lens 421, and an image sensor 440 may be seated in the seating groove. The printed circuit board 450 may be electrically connected to the image sensor 440 via a bonding wire. The printed circuit board 450 may include an image processing unit 457, and may include a connector 453 connected to the image processing unit 457.

According to an embodiment, the connector 453 may be connected to a main printed circuit board, and may transmit processed image data to a processor. The printed circuit board 450 may be made of a flexible printed circuit board, and a cable including the connector 453 may be formed to be flexible.

Figure 5A:
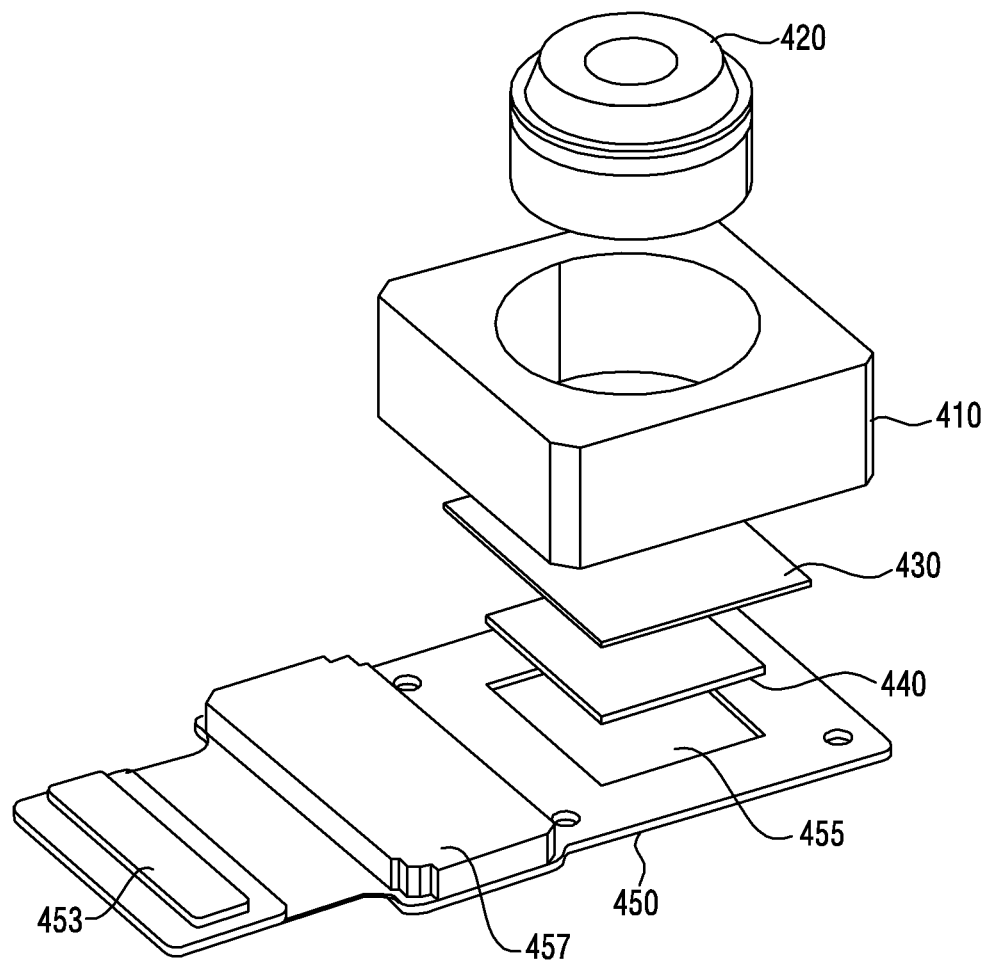
FIG. 5A is an exploded perspective view of a camera module according to an embodiment.
Figure 5B:
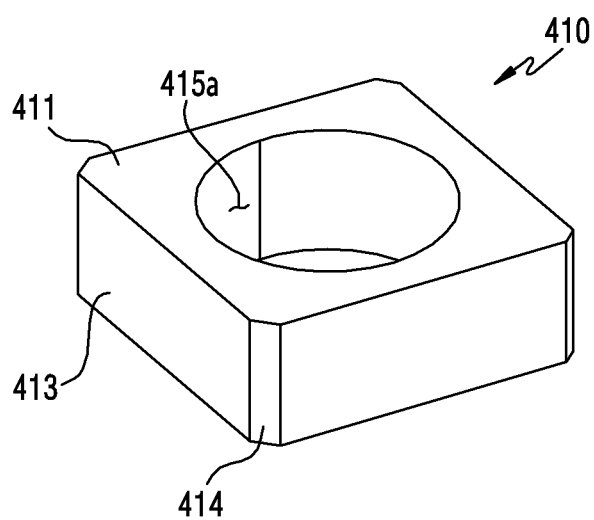
FIGS. 5B and 5C are perspective views of a housing according to an embodiment.
Figure 5C:
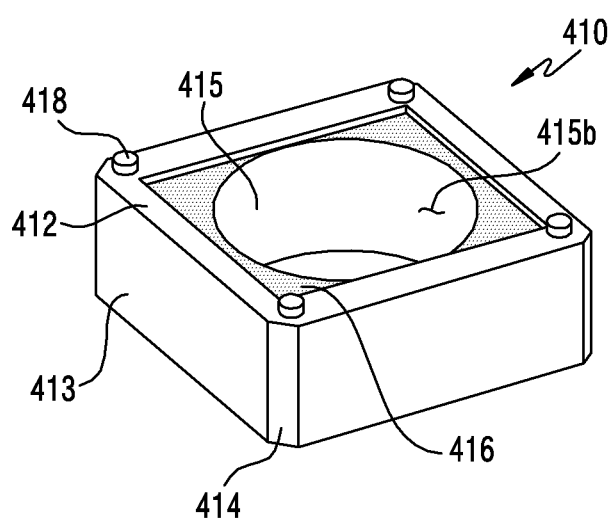

FIG. 5A is an exploded perspective view of a camera module according to an embodiment, and FIGS. 5B and 5C are perspective views of a housing according to an embodiment.

Referring to FIGS. 5A, 5B, and 5C, the camera module 400 may include a housing 410, a lens assembly 420 seated on the housing 410, an infrared filter attached to a second surface 412 of the housing 410, and a printed circuit board 450, which is in contact with the second surface 412 of the housing 410. The printed circuit board 450 may include an image sensor 440 seated in a seating groove 455, an image processing unit 457 configured to process data received from the image sensor 440, and a connector 453.

According to an embodiment, the housing 410 may include a first surface 411, a second surface 412, and a side surface 413. The first surface 411 is a surface through which light is introduced into the lens assembly 420, and the first surface 411 may include a first opening 415a through which light can be introduced into the lens assembly 420. The second surface 412 is a surface through which light passing through the lens assembly 420 is emitted to the infrared filter 430 and the image sensor 440, and may include a second opening 415b through which light is capable of being transmitted from the lens assembly 420 to the image sensor 440. The first opening 415a and the second opening 415b may have a circular shape centered on the optical axis of the lens 421, and in the housing 410, the lens assembly 420 may be disposed in a through hole 415 formed therethrough with reference to the first opening 415a and the second opening 415b. According to an embodiment, the housing 410 may include chamfered regions 414 at corner portions of the side surface 413 so as to secure mounting spaces for other electronic components.

According to an embodiment, a seating groove 416 may be formed in the second surface 412 in a direction away from the image sensor 440 such that the infrared filter 430 can be seated therein. The infrared filter 430 may be spaced apart from the image sensor 440. The space between the infrared filter 430 and the image sensor 440 may be used as a space for arranging a bonding wire for electrical connection between the image sensor 440 and the printed circuit board 450. The second surface 412 may be used as a bonding surface for bonding the printed circuit board 450 and the housing 410, and an adhesive is applied thereto such that the printed circuit board 450 comes into contact therewith so that the printed circuit board 450 and the housing 410 can be coupled to each other. At least one of the bonding surface of the printed circuit board 450 and the bonding surface of the second surface 412 of the housing 410 may be roughened in order to increase the exposed area thereof. The bonding surface of the second surface 412 of the housing 410 may have irregularities on the surface formed through etching or surface treatment such as formation of oxide film, and the bonding surface on the printed circuit board 450 may be widened in the surface area thereof by performing printing thereon. The adhesive applied to the bonding surface may exhibit increased bonding strength due to the widened surface area.

Figure 6:
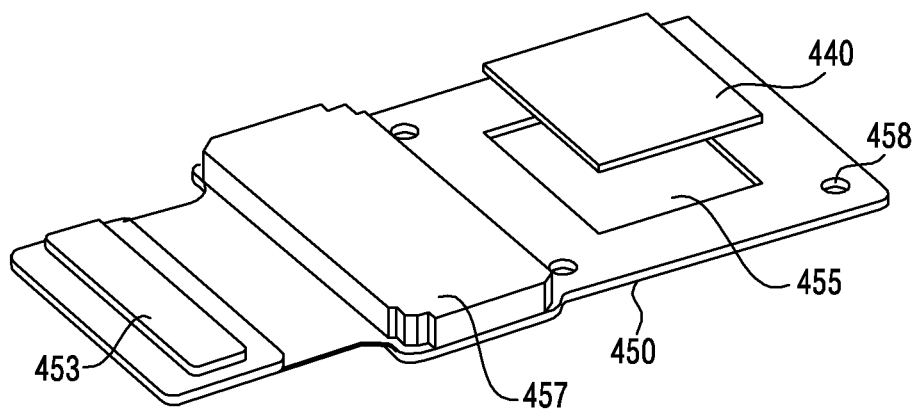
FIG. 6 is a perspective view of a printed circuit board according to an embodiment.
Figure 7:
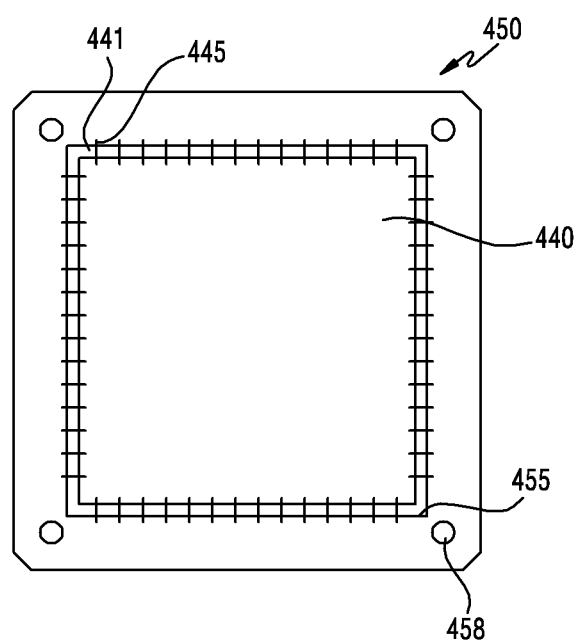
FIG. 7 is a front view of the printed circuit board on which an image sensor according to an embodiment is mounted.

FIG. 6 is a perspective view of a printed circuit board according to an embodiment, and FIG. 7 is a front view of the printed circuit board on which an image sensor according to an embodiment is mounted.

Referring to FIGS. 6 and 7, the printed circuit board 450 may include a seating groove 455, a coupling groove 458, an image processing unit 457, and a connector 453. According to an embodiment, the image sensor 440 may be mounted in the seating groove 455. The image sensor 440 may be electrically connected to the printed circuit board 450 via a bonding wire 445. One end of the bonding wire 445 may be attached to a marginal portion of the image sensor 440, and the other end may be attached to an outer periphery of the seating groove 455. A plurality of bonding wires 445 may be provided, and may be disposed along a marginal portion of the image sensor 440 and a marginal portion of the seating groove 455. The bonding wires 445 may not be disposed at the corners 441 of the image sensor 440. Via the bonding wires 445, the image sensor 440 is capable of transmitting a signal generated by recognizing condensed light to the image processing unit 457 of the printed circuit board 450, and the image processing unit 457 is capable of transmitting data to a main print circuit board connected to the connector 453.

In the four vertex regions of the printed circuit board 450 on the surface on which the image sensor 440 is disposed, coupling grooves 458 may be disposed. The coupling grooves 458 may be coupled to the protrusions 418 of the housing 410. The housing 410 and the printed circuit board 450 are coupled, and the lens assembly 420 seated in the housing 410 is capable of transmitting light to the image sensor 440.

Figure 8:
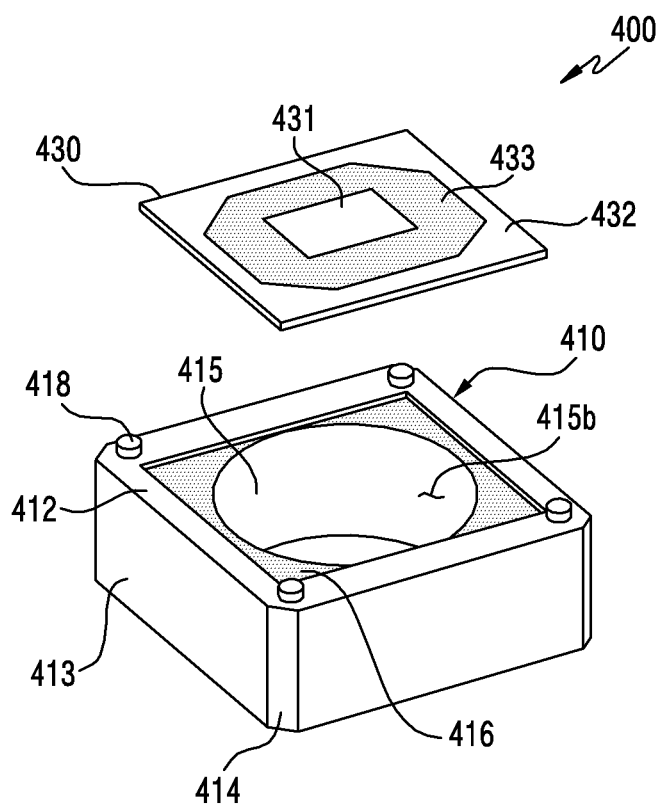
FIG. 8 is a view illustrating a housing and an infrared filter of a camera module according to an embodiment.

FIG. 8 illustrates a housing and an infrared filter of a camera module according to an embodiment.

Referring to FIG. 8, the infrared filter 430 of the camera module 400 may include an effective filtering region 431, an attachment region 432, and a masking region 433.

The effective filtering region 431 may be disposed in the middle of the infrared filter 430. The effective filtering region 431 may remove infrared light from incident light entering through the lens 421 in the lens barrel 422 and through the second opening 415b, and may correspond to an effective sensing region of the image sensor 440. When the light passing through the lens 421 passes through the effective filtering region 431 of the infrared filter 430, infrared rays of the light transmitted to the image sensor 440 may be blocked.

The masking region 433 is positioned on the infrared filter so as to block light incident on a region other than the light reception surface of the image sensor 440. Some of the light passing through the lens assembly 420 may be reflected from the inner wall of the housing 410 or may be reflected by the bonding wires 445 to pass through the infrared filter 430 so as to reach the image sensor 440. Light that is reflected and reaches the image sensor 440 may cause a flare phenomenon that blurs a captured image or creates spots. In order to prevent the reflected light from reaching the image sensor 440, the masking region 433 may be formed in a region adjacent to a marginal portion of the effective filtering region 431 of the infrared filter 430 in order to prevent a flare phenomenon. The masking region 433 may be a black masking region printed with black ink. The masking region 432 may be formed by coating an antireflection material on the top surface or/and the bottom surface of the infrared filter 430.

The attachment region 432 may be a region for attaching the infrared filter 430 to the seating groove 416 of the housing 410. The attachment region 432 is disposed along a marginal portion of the masking region 433 of the infrared filter 430. A bonding material may be interposed between the attachment region 432 of the infrared filter 430 and the seating groove 416 in the housing 410, and the infrared filter 430 and the housing 410 may be coupled to each other by the bonding material. The bonding material may be applied to the recessed seating groove 416 in the second surface 412 of the housing 410, and may be an ultraviolet-curable (UV-curable) adhesive. Ultraviolet rays are capable of reaching the bonding material and curing the bonding material. The attachment region 432 may be made of a transparent member so as to transmit ultraviolet rays, and the attachment region 432 may be kept transparent by performing black masking only in the masking region of the infrared filter 430.

Figure 9A:
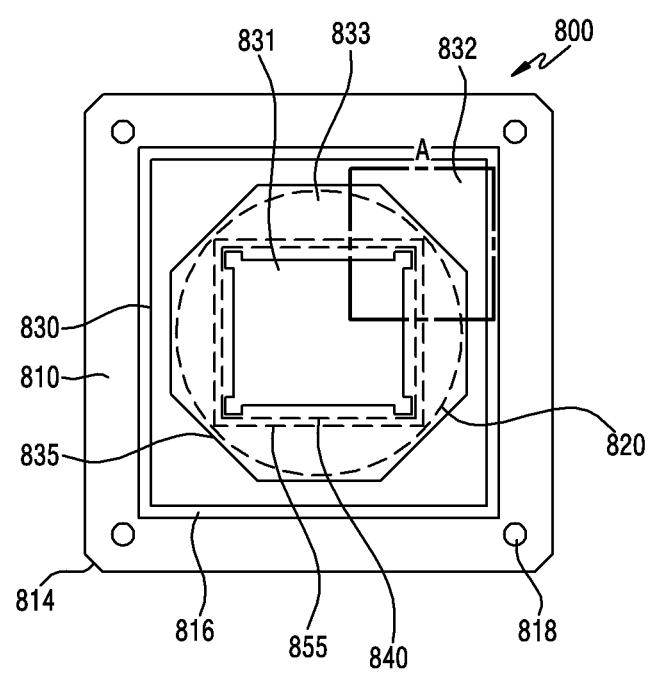
FIGS. 9A, 9B, and 9C are views each illustrating an infrared filter attached to a housing according to an embodiment.
Figure 9B:
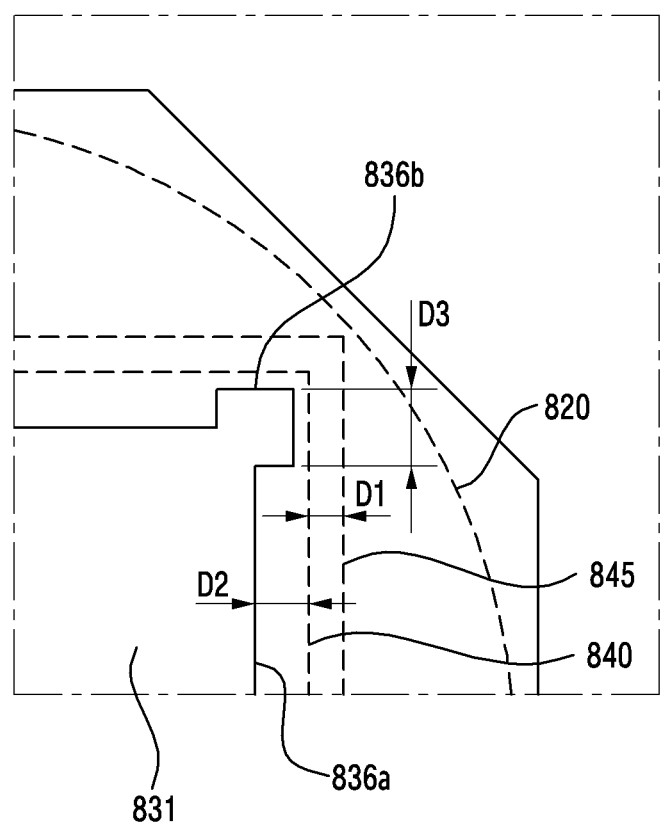
Figure 9C:
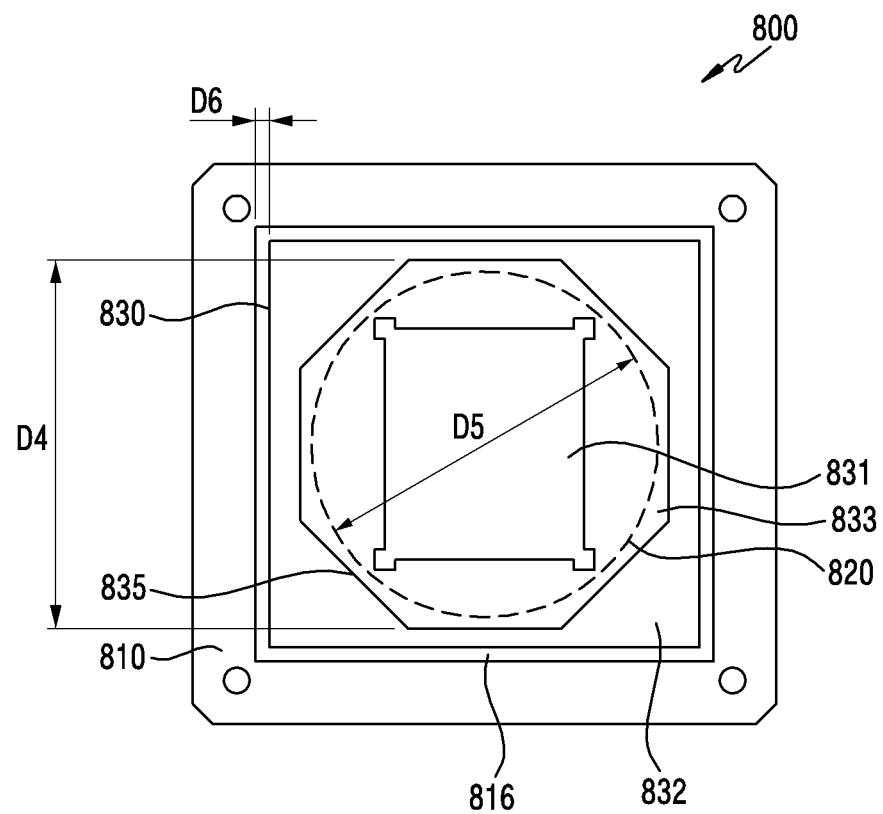

FIGS. 9A, 9B, and 9C illustrate an infrared filter attached to a housing according to an embodiment.

Referring to FIG. 9A, the camera module 800 may include an infrared filter 830 coupled to a housing 810. The masking region 833 may have a larger area than the cylindrical lens barrel 820 so as to completely wrap the cylindrical lens barrel 820. The masking region 833 may be larger than the seating groove 855 in the printed circuit board, and the image sensor 840 may be disposed inside the seating groove 855. The shape of the seating groove 855 may have a shape corresponding to the image sensor 840, and the image sensor 840 may have a rectangular shape.

According to various embodiments, in order to secure an attachment region 832, the masking region 833 may be kept to a minimum, and the masking region 833 may be chamfered in the regions corresponding to the vertices of the housing so as to add edges 835. The chamfered regions may be used as attachment regions, thereby enhancing bonding strength.

According to an embodiment, some of the light incident on the corner regions of the light reception surface of the image sensor 840 may not reach the corner regions, and thus an image or picture recognized by the image sensor 840 may be displayed to be more blurred in the corner regions than other regions. According to various embodiments, an image or picture recognized by the image sensor 840 may be blurred by light reflected from the bonding wires disposed for electrical connection between the image sensor 840 and the printed circuit board. According to an embodiment, the masking region 833 may be disposed to prevent reflection of light by the bonding wires while securing an area that allows sufficient light to reach the image sensor 840.

According to an embodiment, in order to prevent light from being reflected by the bonding wires (e.g., the bonding wires 445 in FIG. 7), the effective filtering region 831 may have a masking region 833 formed to block a region in which the bonding wires are disposed from the image sensor 840. In order to cover the region in which the bonding wires are disposed, the masking region 833 may extend from the centers 836a of the edges of the effective filtering region 831 to the inner side of the effective filtering region 831.

According to various embodiments, when the infrared filter 830 has the effective filtering region 831, mechanical tolerances between components of the camera module, placement of bonding wires, and the like may be considered. In the camera module, the effective filtering region 831 may have different widths from a marginal portion of the image sensor 840.

Referring to FIG. 9B, the effective filtering region 831 may include a central region 836a forming a center and a corner region 836b protruding outward from a vertex of the central region 836a. The corner region 836b may be formed in a quadrangle shape.

According to an embodiment, the distance D1 may be a vertical distance from a marginal portion of the image sensor 840 to a marginal portion of the seating groove 855 in the printed circuit board, and the distance D2 may be a vertical distance from the central region 836a of the effective filtering region 831 to the marginal portion of the image sensor 840. The distance D3 may be the length of one side of the quadrangle shape formed in the corner region 836b of the effective filtering region 831. A quadrangle formed in the corner region 836b according to an embodiment may be a square, the distance D2 may be half of the distance D3, and the distance D2 and the distance D1 may be the same.

According to various embodiments, when the distance D2 is greater than the distance D1 or half of the distance D3 is greater than the distance D1, for example, when the corner region 836b is formed greater, light may reach a region other than the surface of the image sensor 840 (e.g., the bonding wires 445 in FIG. 7), the reaching light may be reflected to cause a flare phenomenon.

According to another embodiment, when the distance D2 is smaller than the distance D1 or half of the distance D3 is smaller than the distance D1, for example, when the corner region 836b is formed smaller, the light may reach an area smaller than the light reception area of the image sensor 840, and the reaching light becomes insufficient, resulting in a vignette phenomenon in which edges are blurred.

According to an embodiment, the masking region 833 may be formed by coating or printing an antireflective material. The material applied to the masking region 833 may block ultraviolet rays required for curing the bonding material applied to the attachment region 832. When the masking region 833 is formed in the entire region other than the effective filtering region 831 of the infrared filter 830, it may be difficult to bond the infrared filter 830 to the seating groove 816 in the housing 810. When the infrared filter 830 is not closely bonded to the housing 810, a defect such as stain may be caused in an image or picture acquired by the image sensor 840.

According to an embodiment, the infrared filter 830 may include a masking region 833 surrounding a marginal portion of the effective filtering region 831, and the remaining regions other than the masking region 833 and the effective filtering region 831 may form the attachment region 832. The infrared filter 830 and the seating groove 816 in the housing 810 may be spaced apart from each other.

According to an embodiment, the longest distance in the masking region 833 may be greater than the diameter of the lens barrel 820 or the diameter of the through hole of the housing 810. According to various embodiments, the longest distance in the masking region 833 may be the distance D4, the diameter of the lens barrel 820 or the diameter of the through hole of the housing 810 may be the distance D5, and the separation distance between the infrared filter 830 and the seating groove 816 may be the distance D6. The relationship between the distances D4, D5, and D6 may be D5<=D4<=(D5+2*D6). According to various embodiments, the longest distance in the masking region 833 may be greater than the diameter of the lens barrel 820 or the diameter of the through hole in the housing 810, and may be smaller than the sum of the diameter of the lens barrel 820 or the through hole in the housing 810 and twice the spacing distance between the infrared filter 830 and the seating groove 816.

According to various embodiments, when the longest distance D4 in the masking region 833 is smaller than the diameter of the lens barrel 820 or the diameter D5 of the through hole in the housing 810, light entering through the lens barrel 820 is incident on a region other than the light reception surface of the image sensor, and is reflected by electronic components near the image sensor, causing a flare phenomenon. When the longest distance D4 in the masking region 833 is greater than the sum of the diameter of the lens barrel 820 or the diameter of the through hole in the housing 810 and twice the separation distance between the infrared filter 830 and the seating groove 816 (D5+2*D6), the area of the attachment region 832 is not sufficient when a bonding material is applied to the attachment region 832 so as to bond the infrared filter 830 and the housing 810 to each other, and thus bonding strength may decrease.

Figure 10A:
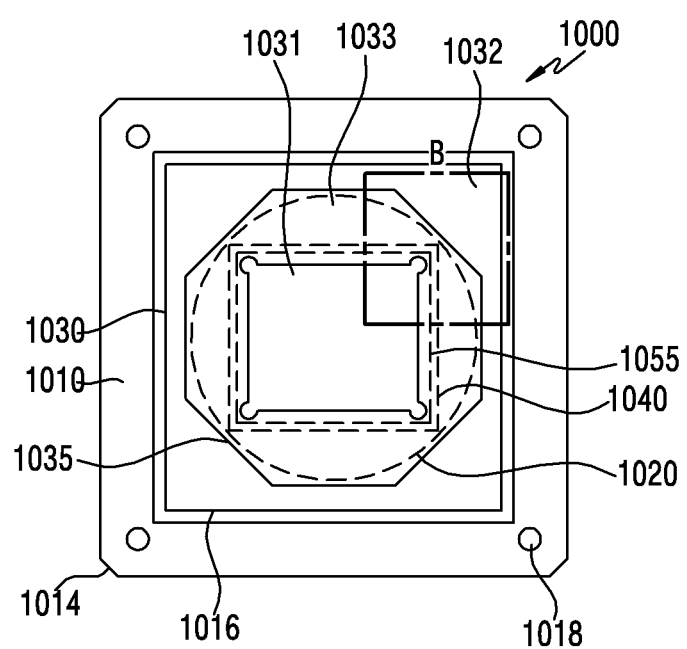
FIGS. 10A and 10B are views each illustrating an infrared filter attached to a housing according to various embodiments.
Figure 10B:
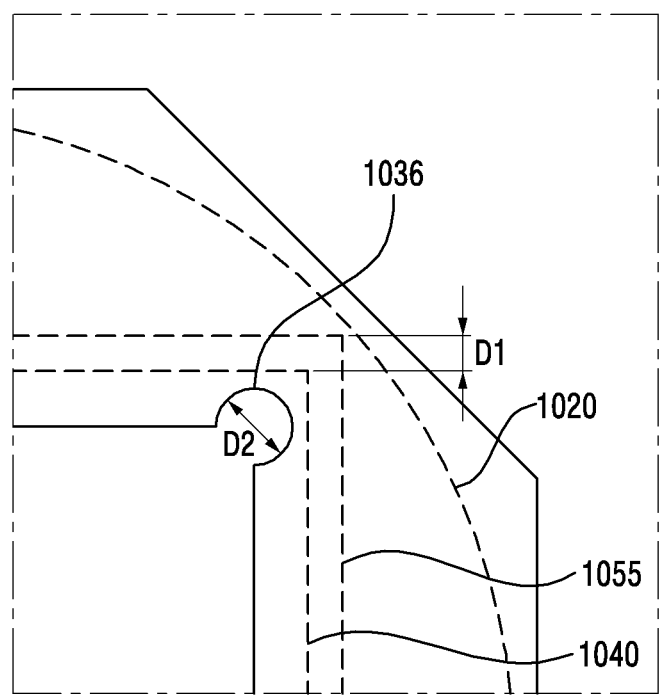

FIGS. 10A and 10B illustrate an infrared filter attached to a housing according to various embodiments.

Referring to FIG. 10A, the camera module 1000 may include an infrared filter 1030 coupled to a housing 1010. The masking region 1033 may have a larger area than the cylindrical lens barrel 1020 so as to completely wrap the cylindrical lens barrel 1020. The masking region 1033 may be larger than the seating groove 1055 in the printed circuit board, and the image sensor 1040 may be disposed inside the seating groove 1055. The shape of the seating groove 1055 may have a shape corresponding to the image sensor 1040, and the image sensor 1040 may have a rectangular shape.

According to an embodiment, the masking region 1033 may be formed in a quadrangle shape, but in order to secure the attachment region 1032, an edge 1035 adjacent to the lens barrel 1120 may be added.

Referring to FIG. 10B, when the corner region 1036 is curved, the distance D1 may be a vertical distance from a marginal portion of the image sensor 1040 to a marginal portion of the seating groove 1055. The distance D2 may be a diameter of a circle formed in a corner region 1036.

According to an embodiment, D2 may be 2*D1. That is, the diameter of the circle formed in the corner region 1036 may be twice the separation distance between the image sensor 1040 and the seating groove 1055. When the diameter of the circle formed in the corner region 1036 is greater, a flare phenomenon may occur. When the diameter of the circle formed in the corner region 1036 is smaller, a vignette phenomenon may occur.

Figure 11A:
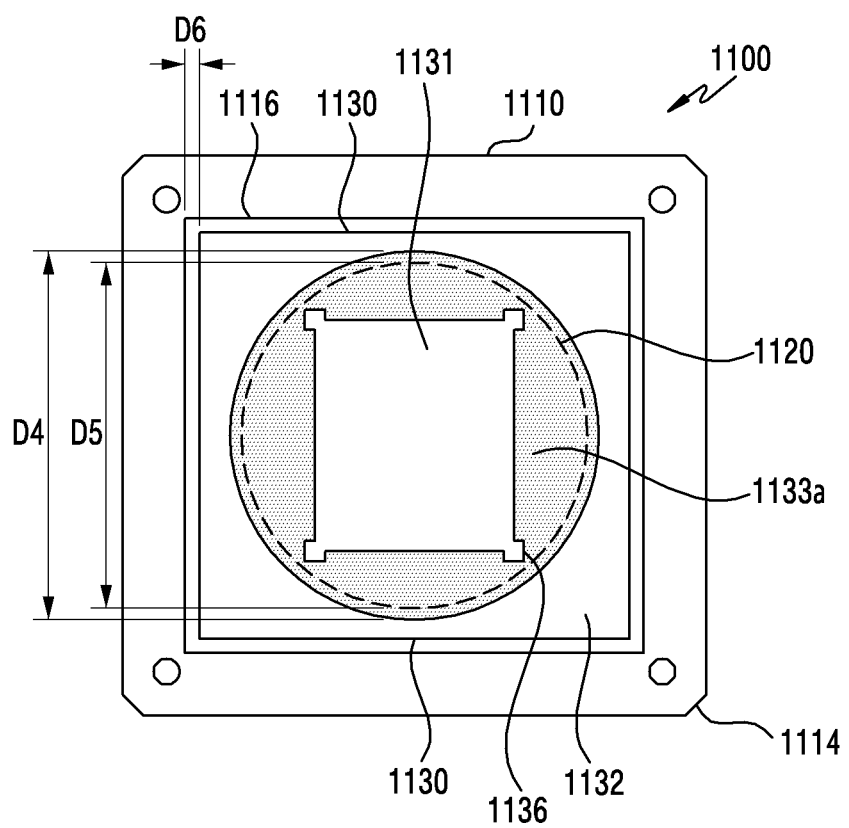
FIGS. 11A, 11B, and 11C are views illustrating various masking regions in an infrared filter according to various embodiments.
Figure 11B:
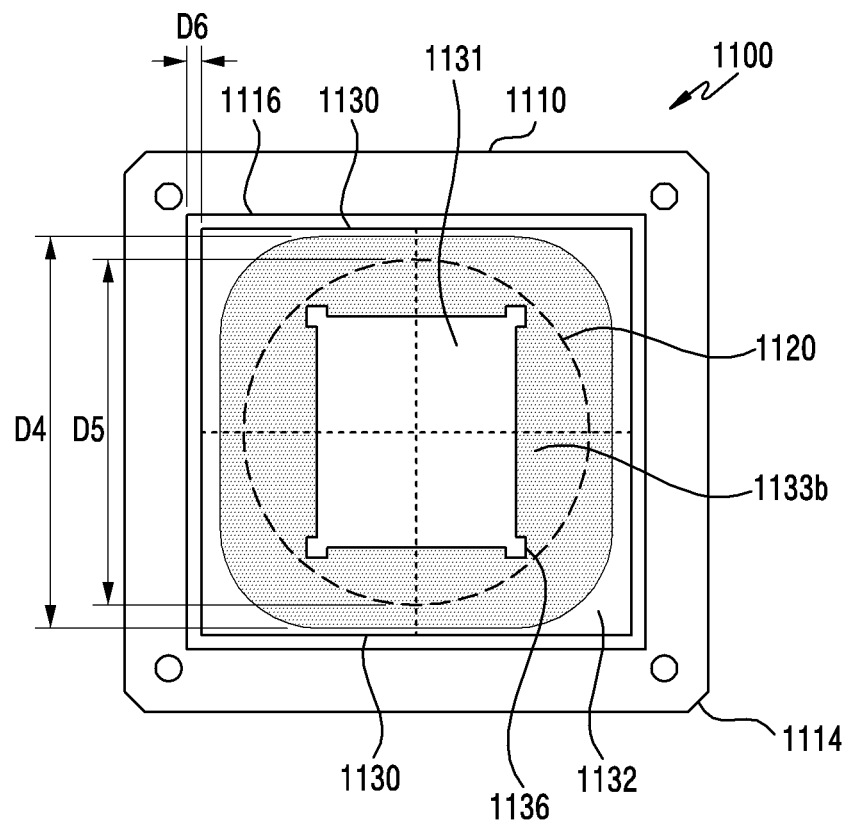
Figure 11C:
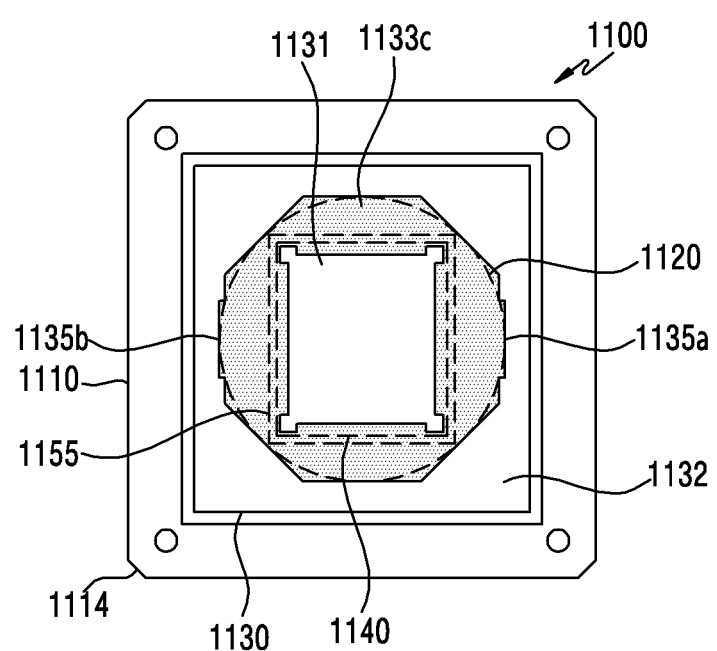

FIGS. 11A, 11B, and 11C illustrate various masking regions in an infrared filter according to various embodiments.

Referring to FIG. 11A, the infrared filter 1130 of the camera module 1100 may include a circular masking region 1033a, different from FIGS. 9A and 10A. Referring to FIG. 11B, a masking region 1033b having rounded edges may be included.

In FIG. 11A, the distance D5 may be the diameter of a through hole 1120 in the housing 1110, and the distance D4 may be the diameter of a black masking region 1133a. D6 may be the distance between a marginal portion of an infrared filter 1130 and a marginal portion of a seating groove 1116. In order to secure the bonding strength of the attachment region 1132 of the infrared filter 1130 with respect to the housing 1110, D5<=D4<=(D5+2D6) may be satisfied. In FIG. 11B, the distance D4 may be the width of the central region of the masking region 1133b, and in order to secure the bonding strength of the attachment region 1132 of the infrared filter 1130 with respect to the housing 1110, D5<=D4<=(D5+2D6) may be satisfied.

According to an embodiment, the corner regions 1136 of the effective filtering region 1131 may protrude from the central region of the effective filtering region 1131, may have a circular shape or a quadrangle shape, and may satisfy the conditions described above with reference to FIGS. 9B and 10B.

Referring to FIG. 11C, the camera module 1100 may include a masking region 1133c of the infrared filter 1130 formed in a polygonal shape. Among the polygonal edges of the masking region 1133c, at least a pair of opposite edges 1135a and 1135b may be designed to protrude. Each edge of the masking region 1133c may be formed to be in contact with the through hole 1115 in the housing 1110, and the area of the attachment region 1132 may be maximized by minimizing the masking region 1133c.

The effective filtering region 1131 of the infrared filter 1130, the image sensor 1140, and the seating groove 1116 may be rectangular and may have two long edges. The masking region 1133c may be formed to be in contact with the through hole 1115 in the housing 1110. In the long edge regions, the pair of edges 1135a and 1135b may be formed to face each other in protruding shapes in order to increase the area of the attachment region 1132.

Figure 12A:
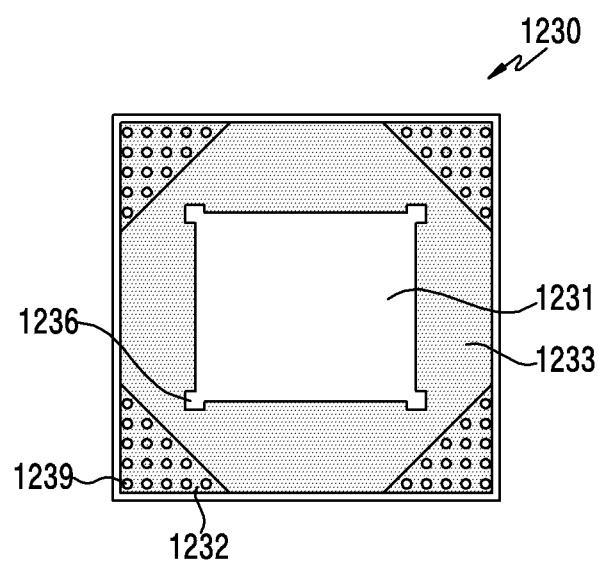
FIGS. 12A, 12B, and 12C are views illustrating masking regions and attachment regions of various shapes according to an embodiment.
Figure 12B:
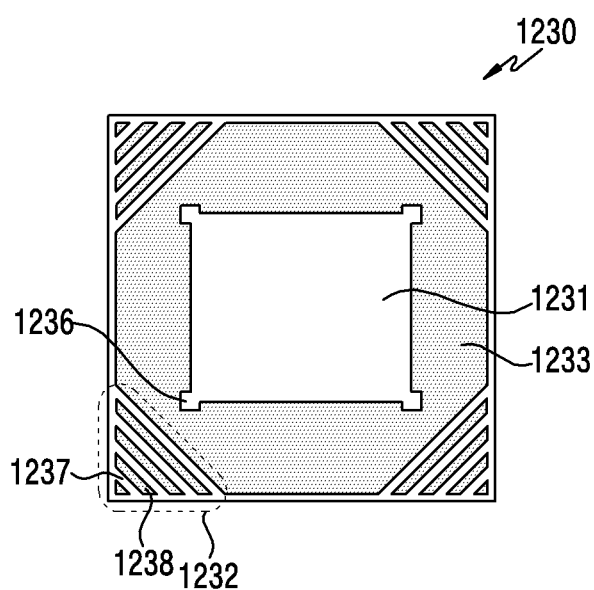
Figure 12C:
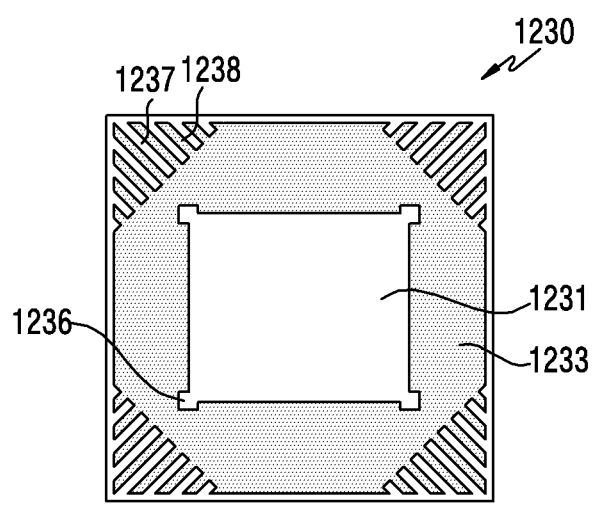

FIGS. 12A, 12B, and 12C illustrate masking regions and attachment regions of various shapes according to an embodiment.

Referring to FIG. 12A, an infrared filter 1230 may be disposed to overlap a masking region 1233 and an attachment region 1232. An effective filtering region 1231 may be formed such that corner regions 1236 protrude, as described above. A hole 1239 may be fabricated as a hole penetrating the infrared filter 1230 and may be formed such that masking is not formed.

According to an embodiment, the attachment region 1232 may include holes 1239 through which ultraviolet rays are capable of passing. A bonding material may be injected into the holes 1239, and the infrared filter 1230 can be bonded to the housing by curing the bonding material using ultraviolet rays.

According to various embodiments, the holes 1239 formed in the attachment region 1232 are unmasked regions, and the bonding material applied to one surface of the housing may be cured by ultraviolet rays passing through the holes 1239 so that the infrared filter 1230 can be bonded to the housing.

Referring to FIGS. 12B and 12C, the attachment region 1232 may overlap the masking region 1233, and masked regions 1238 formed in the attachment region 1232 and unmasked regions 1237 may be alternately arranged. The unmasked regions 1237 may be arranged at regular intervals to be parallel to respective edges of the masking region 1233, or the unmasked regions 1237 may be arranged at regular intervals to be perpendicular to respective edges of the masking region 1233.

The unmasked regions 1237 and the holes 1239 may be arranged at regular intervals such that ultraviolet rays are uniformly transmitted, thereby improving curing efficiency.

Figure 13:
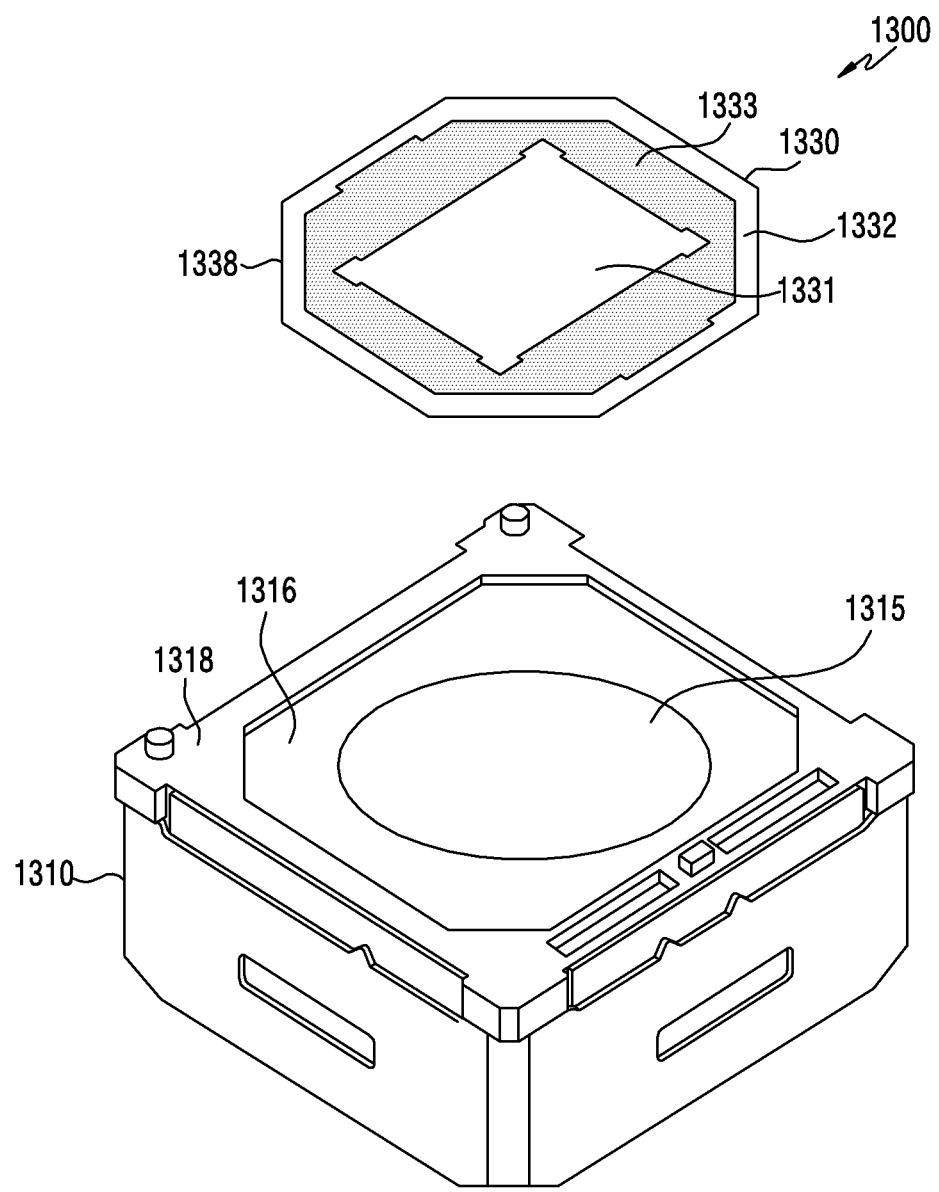
FIG. 13 is a view illustrating an infrared filter and a seating groove, which may have various shapes, according to an embodiment.

FIG. 13 illustrates an infrared filter and a seating groove, which may have various shapes, according to an embodiment.

Referring to FIG. 13, an infrared filter 1330 of a camera module 1300 may include an effective filtering region 1331, a masking region 1333, and an attachment region 1332. The shapes of the effective filtering region 1331 and the masking region 1333 may be formed as described above, and the attachment region 1332 may be formed in a polygonal shape, rather than in a quadrangle shape. Edges 1338 may be added to the infrared filter 1330 through chamfering in the vertex regions of the housing 1310.

According to an embodiment, the seating groove 1316 in the housing 1310 may be formed to correspond to the shape of the infrared filter 1330, and a coupling region 1318 to be coupled with a printed circuit board may be formed to have a large area, so that the bending strength between the printed circuit board and the housing 1310 can be increased.

Figure 14A:
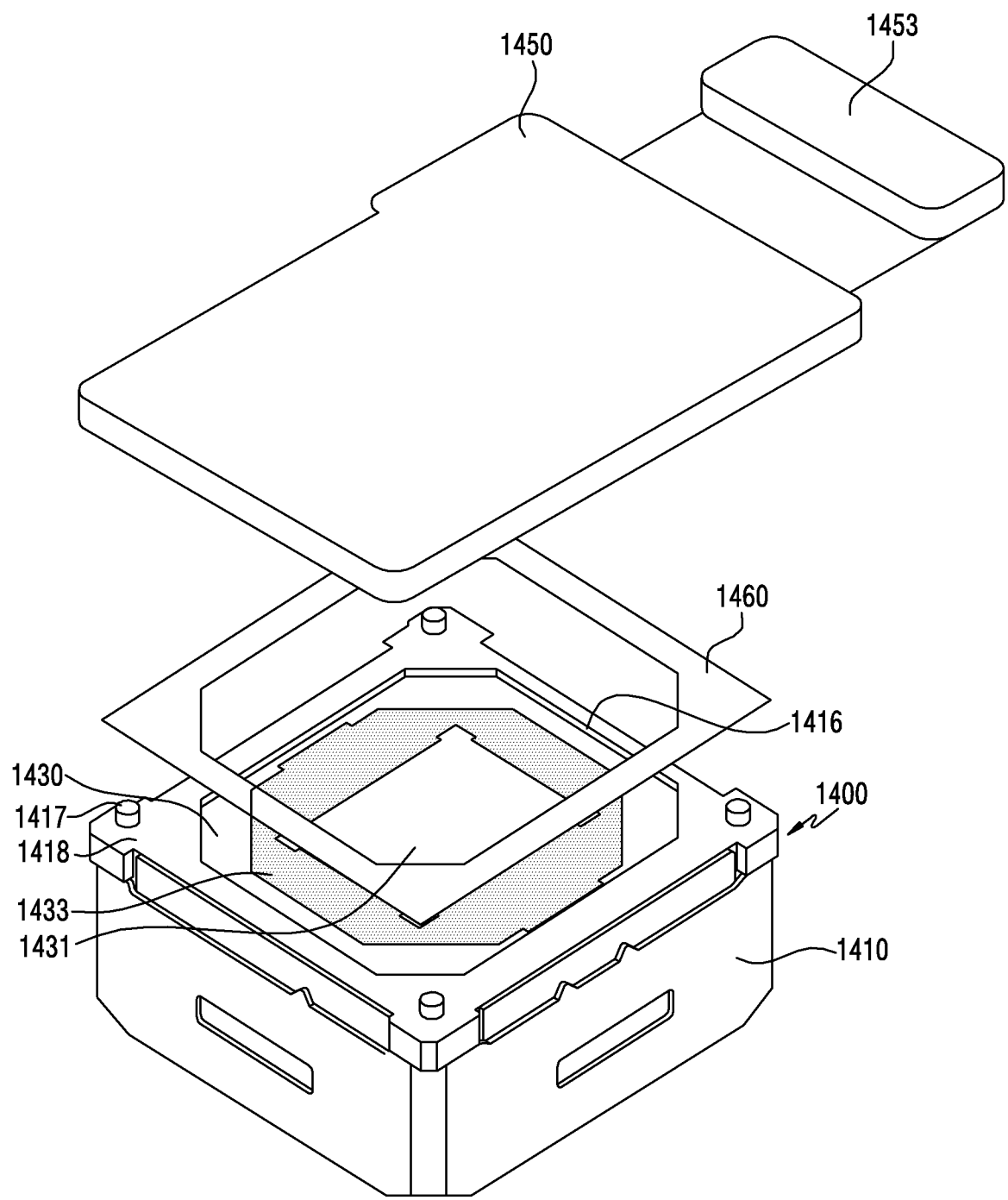
FIG. 14A is a view illustrating a process of bonding a housing of a camera module to a printed circuit board according to an embodiment.
Figure 14B:
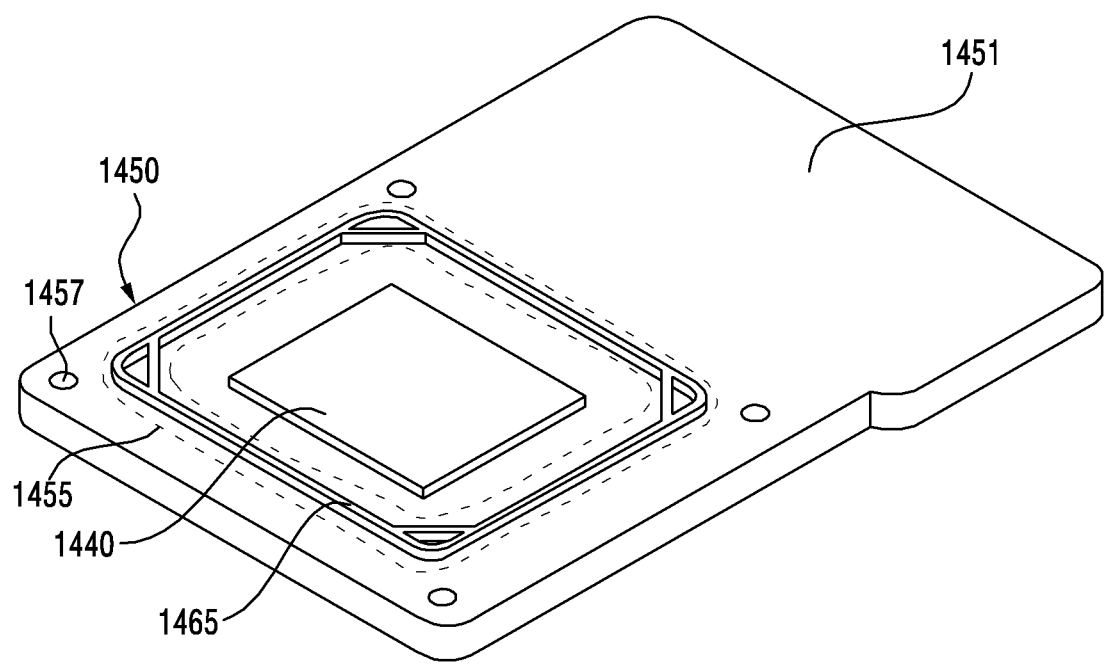
FIG. 14B is a perspective view of the printed circuit board.

FIG. 14A is a view illustrating a process of bonding a housing of a camera module to a printed circuit board according to an embodiment, and FIG. 14B is a perspective view of the printed circuit board.

Referring to FIG. 14A, the housing 1410 of the camera module may include a coupling region 1418 on the surface of the housing 1410 to be attached to a printed circuit board 1450. The coupling region 1418 may be disposed around the seating groove 1416 in the housing 1410. In order to fix the printed circuit board 1450 and the housing 1410 in a bonding region 1455 located on the surface 1451 of the printed circuit board 1450 facing the housing 1410, a bonding layer 1460 may be disposed between the housing 1410 and the printed circuit board 1450. According to an embodiment, depending on the arrangement of the components on the printed circuit board 1450, the bonding layer 1460 may be adjacent to the attachment region of the infrared filter 1430, and the bonding region 1455 of the printed circuit board 1450 may be narrow. In the narrow bonding region 1455, an adhesive 1465 may be insufficient to attach the housing 1410 to the printed circuit board 1450, and thus the housing 1410 may be separated from the printed circuit board 1450. Light may leak out due to the separation of the printed circuit board 1450 and the housing 1410, or light may be introduced from the outside to affect the quality of the camera module 1400.

According to an embodiment, in order to increase the bonding strength between the housing 1410 and the printed circuit board 1450, it is possible to widen the area of the coupling region 1418 between the bonding region 1455 of the printed circuit board 1450 and the housing 1410.

In order to widen the coupling region 1418 and the bonding region 1455, the seating groove 1416 and the infrared filter 1430 may be formed in a shape having chamfered edges, the chamfered edge regions may be used as coupling regions 1418 to be coupled with printed circuit board 1450, and the coupling region 1418 coupled with the printed circuit board 1450 may be widened by the area of the chamfered regions.

Figure 15:
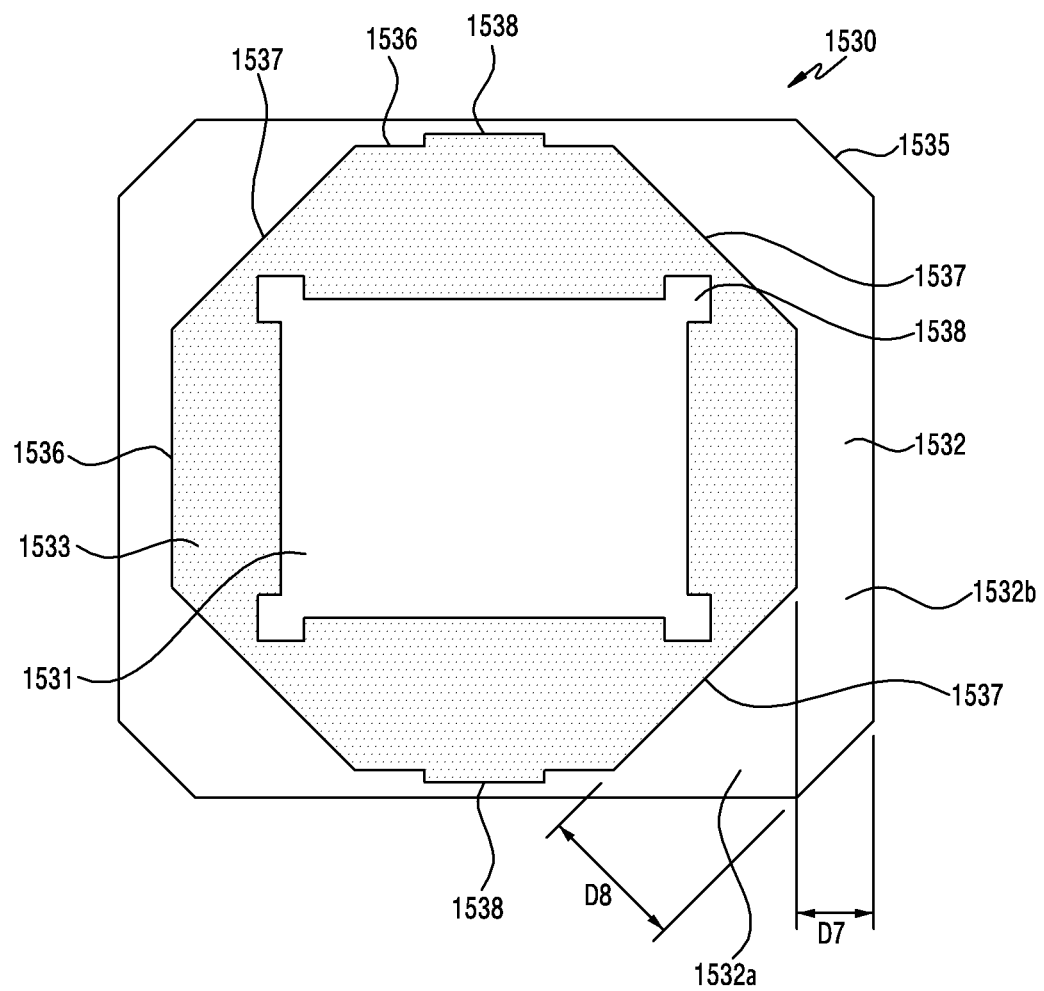
FIG. 15 is a plan view of an infrared filter including a masking region according to an embodiment.
Figure 16:
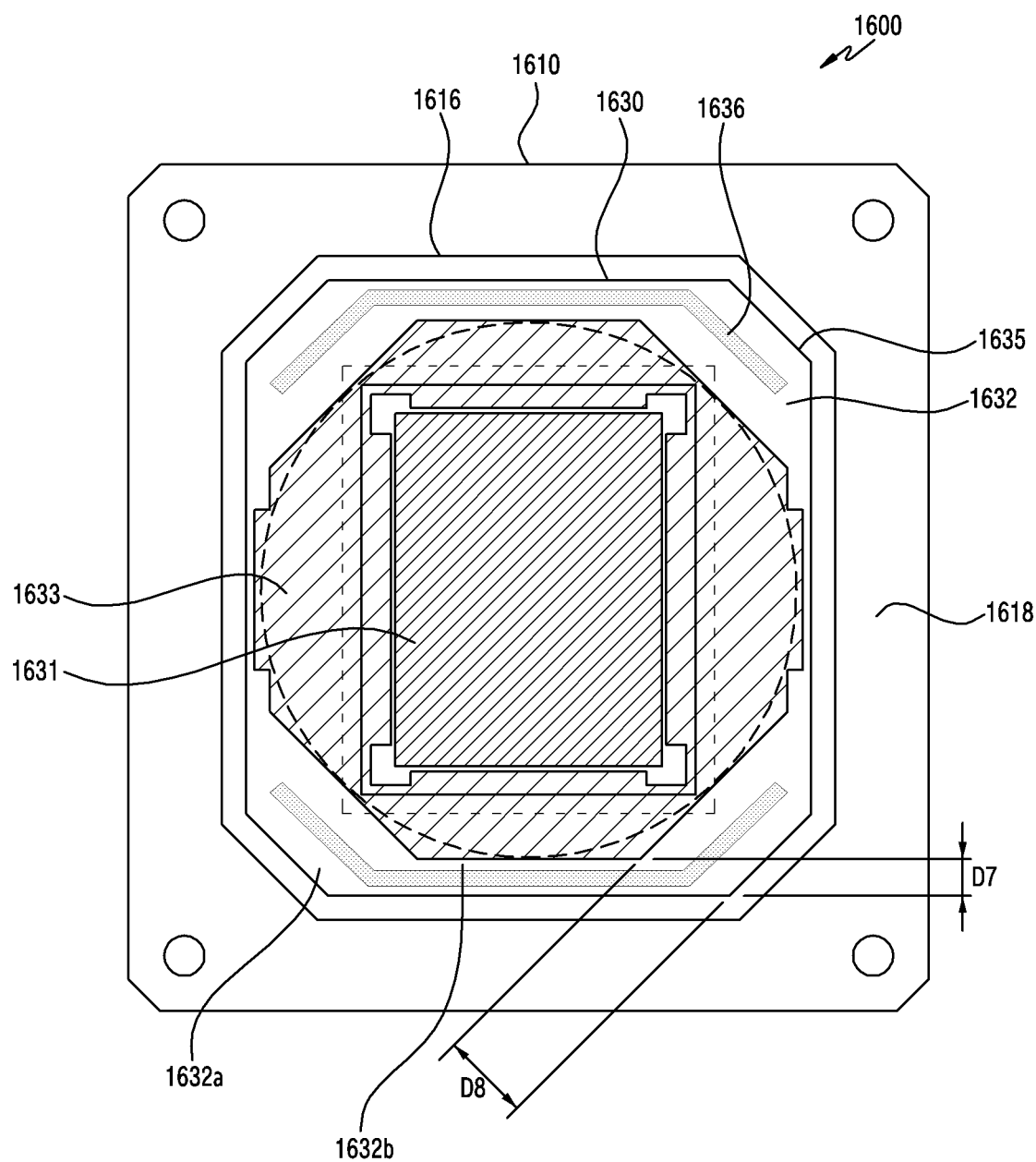
FIG. 16 is a plan view of a housing to which an infrared filter is attached according to an embodiment.

FIG. 15 is a plan view illustrating an infrared filter including a masking region according to an embodiment, and FIG. 16 is a plan view illustrating a housing to which an infrared filter is attached according to an embodiment.

Referring to FIG. 15, the infrared filter 1530 may include an effective filtering region 1531, a masking region 1533, and an attachment region 1532.

According to an embodiment, the effective filtering region 1531 may have a groove recessed inward from the centers of the edges, and corner regions 1538 may have protruding shapes with grooves recessed at four edges. The masking region 1533 may be formed to have edges parallel to the outer edges of the infrared filter 1530, and may be formed to surround the effective filtering region 1531. In the masking region 1533, protrusions 1538 may be formed at the edges parallel to the long edges of the effective filtering region 1531, and additional edges 1535 may be included in the regions corresponding to the chamfered edges 1535 of the infrared filter 1530. Edges 1536, 1537, and 1538 of the masking region 1533 may be formed to be in contact with a through hole in the housing.

According to an embodiment, the distance D8 between the chamfered edges 1535 of the infrared filter 1530 and the chamfered edges 1537 of the masking region may be greater than the maximum distance D7 between the edges of the infrared filter 1530 and the edges 1536 of the masking region.

Referring to FIG. 16, the edges of an infrared filter 1630 of a camera module 1600 may be chamfered, and the housing 1610 and the seating groove 1616 in the housing 1610 may be formed in a shape corresponding to the shape of the infrared filter. With the housing 1610 having edges corresponding to the chamfered edges of the infrared filter 1630, it is possible to further secure a space for coupling a printed circuit board to the housing 1630. According to various embodiments, a sufficient attachment region 1632 may be secured in order to maintain bonding between the infrared filter 1630 and the housing 1610.

According to an embodiment, the infrared filter bonding material 1636 may be disposed in consideration of the appearance of the infrared filter 1630 and the shape of the masking region 1633. In a preferred embodiment of the disclosure, a bonding material 1636 may be disposed on the attachment regions 1632 positioned between the outline of the infrared filter 1630 and the masking region 1633, and may be bent at an obtuse angle and extend in chamfered regions 1632a of the attachment regions 1632.

Figure 17:
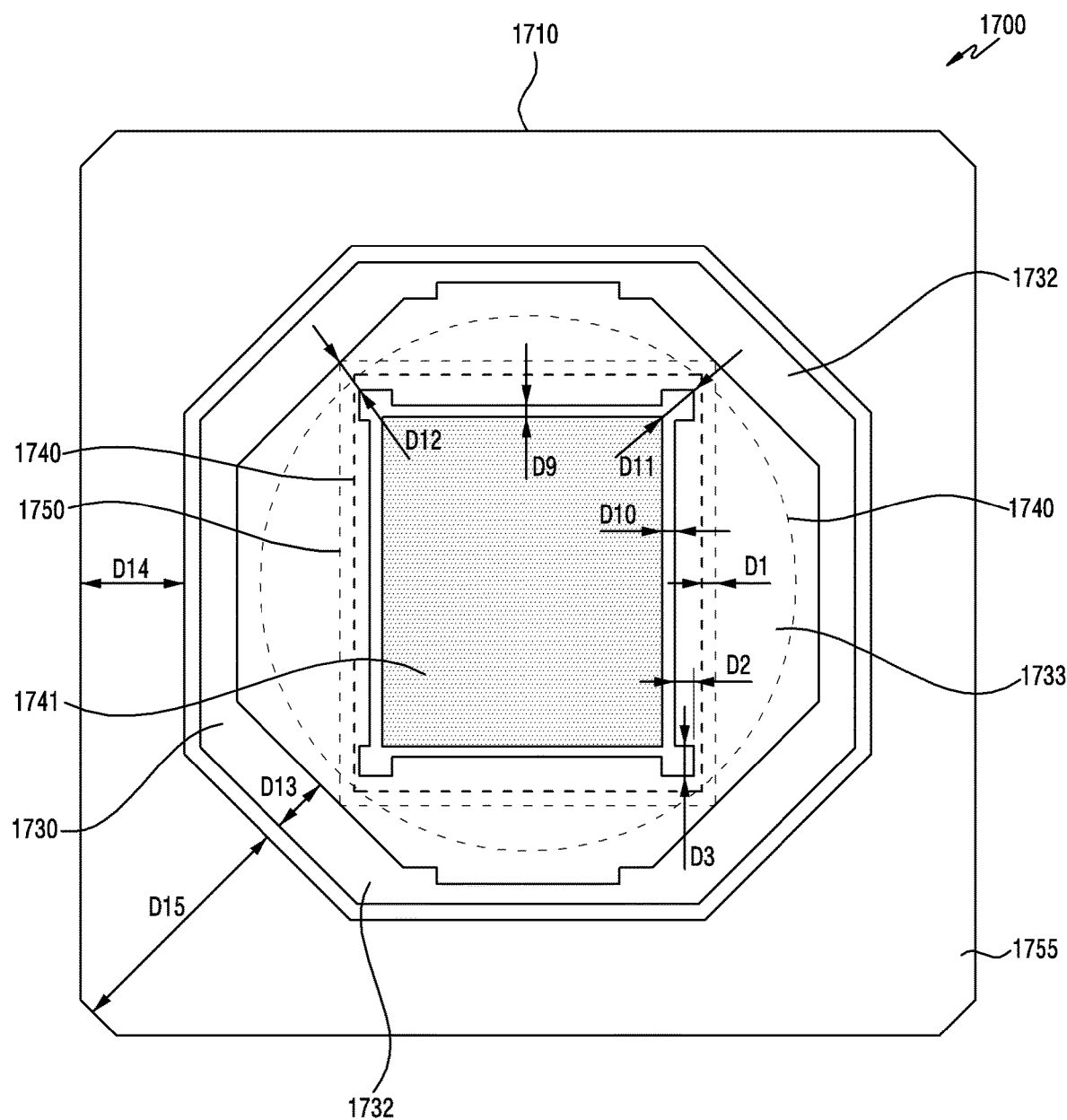
FIG. 17 is a plan view of a chamfered housing according to an embodiment.

FIG. 17 is a plan view of a chamfered housing according to an embodiment.

Referring to FIG. 17, the camera module 1700 may include a housing 1710 and an infrared filter 1730. The distances D9 and D10 may be the shortest distance between the marginal portion of the effective filtering region of the infrared filter 1730 and the effective region 1741 of the image sensor 1740. The distance D11 may be the distance between the corner regions of the effective region 1741 of the image sensor 1740 and the corner regions of the effective filtering region. The effective region 1741 of the image sensor 1740 and the effective filtering region of the infrared filter 1730 may be spaced apart from each other in consideration of the tolerance of the assembly.

The distance D12 may be the distance between the corners of the effective region of the infrared filter and the chamfered edges of the masking region. The distance D12 may be larger than the difference between the width of the masking region 1733 and the diameter of the through hole in the housing 1410.

The distance D13 may be the distance between the chamfered edges 1735 of the masking region 1733 and the chamfered edges of the infrared filter. The area of the attachment region 1732 between the infrared filter 1730 and the housing 1710 may be determined based on the distance D13. The distance D13 may be twice the width of an applied adhesive or more, and the distance D13 may be determined as a distance capable of securing the bonding strength of the adhesive.

The distance D14 may be the shortest distance between the edges of the housing 1710 and the edges of the infrared filter 1730. The distance D14 may be associated with the bonding region 1755 between the housing 1710 and the printed circuit board. A sufficient bonding area is required in order to increase the adhesion between the housing 1710 and the printed circuit board. However, since the dimensions of the housing 1710 are limited, the distance D14 may also be limited.

The distance D15 may be a distance between the chamfered edges of the infrared filter 1730 and the chamfered edges of the housing 1710. Since the distance D14 is limited, it is possible to secure the bonding area between the housing 1710 and the printed circuit board by securing the distance D15 so that bonding strength can be secured. Since the corner regions of the housing 1710 including the distance D15 have large bonding areas, the areas of the corner regions may be reduced in order to mount components of the printed circuit board.

When the size of the housing 1710 is reduced, a space for securing an active region 1741 of the image sensor 1740 may be reduced. Thus, the size may be determined in consideration of the distance from the active region of the housing. In order to reduce the size of the housing 1710, distances D11, D12, and D13 should be minimized.

Figure 18A:
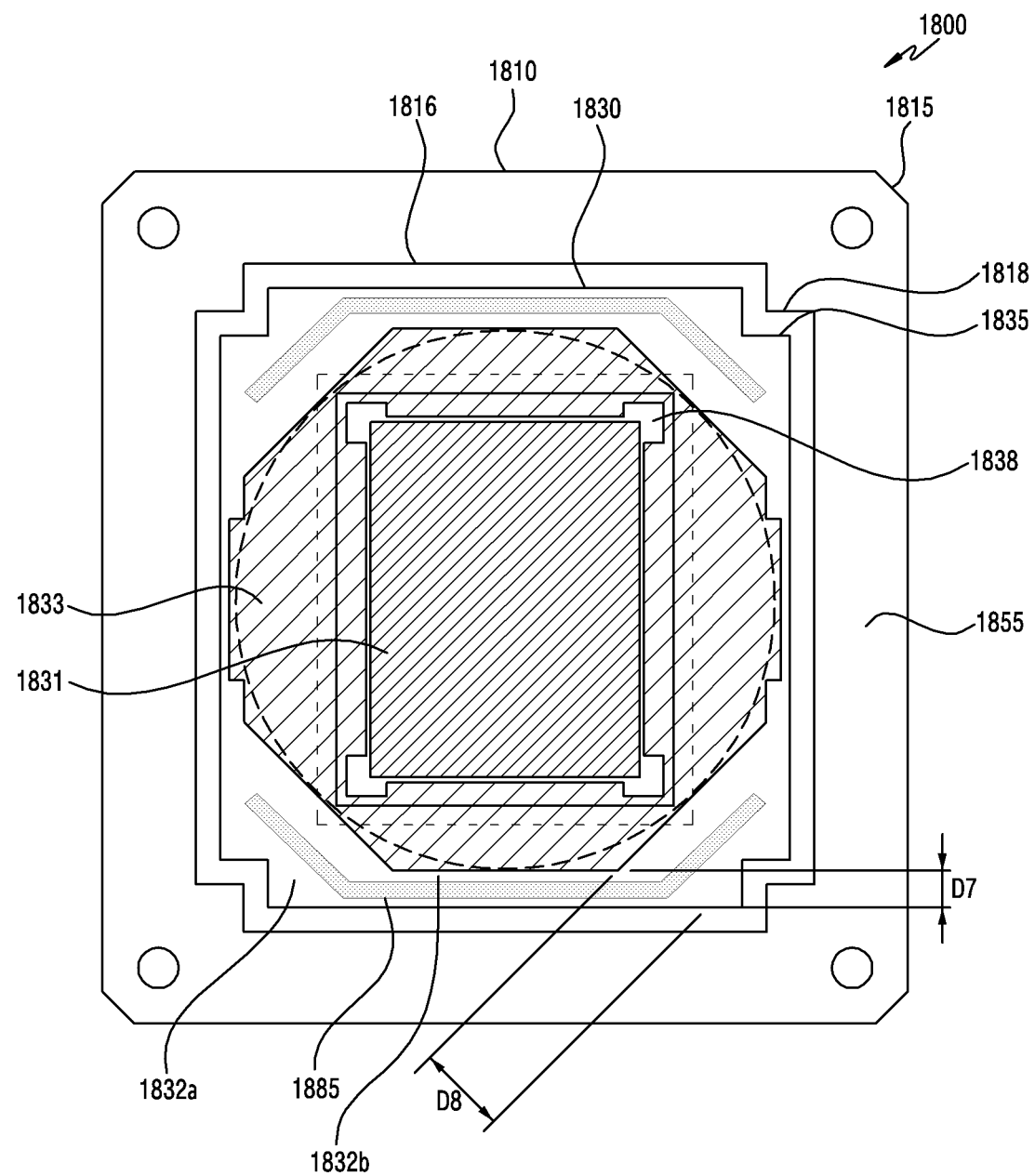
FIGS. 18A, 18B, and 18C are views illustrating various types of infrared filters and mounting grooves in the camera module according to an exemplary embodiment.
Figure 18B:
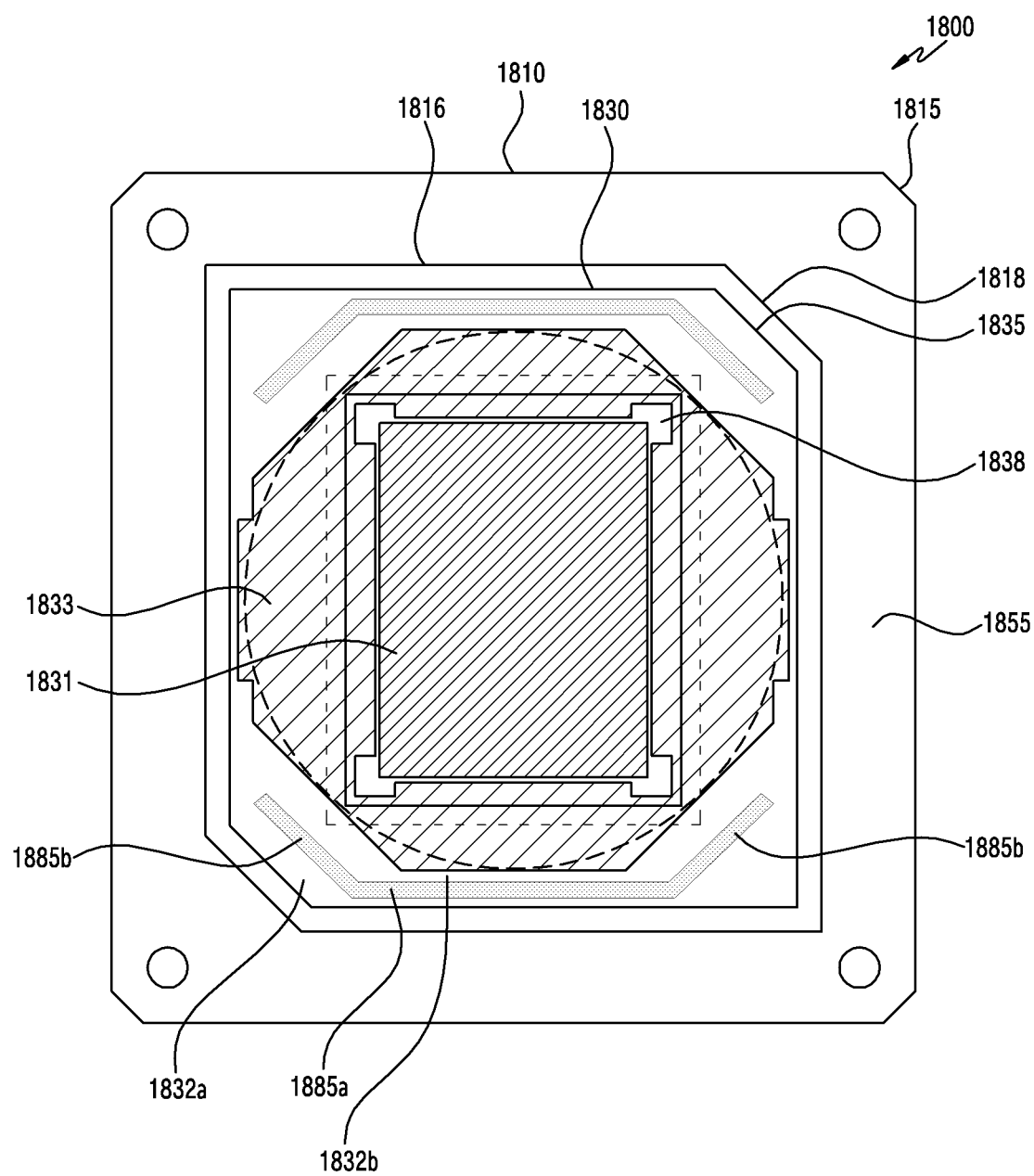
Figure 18C:
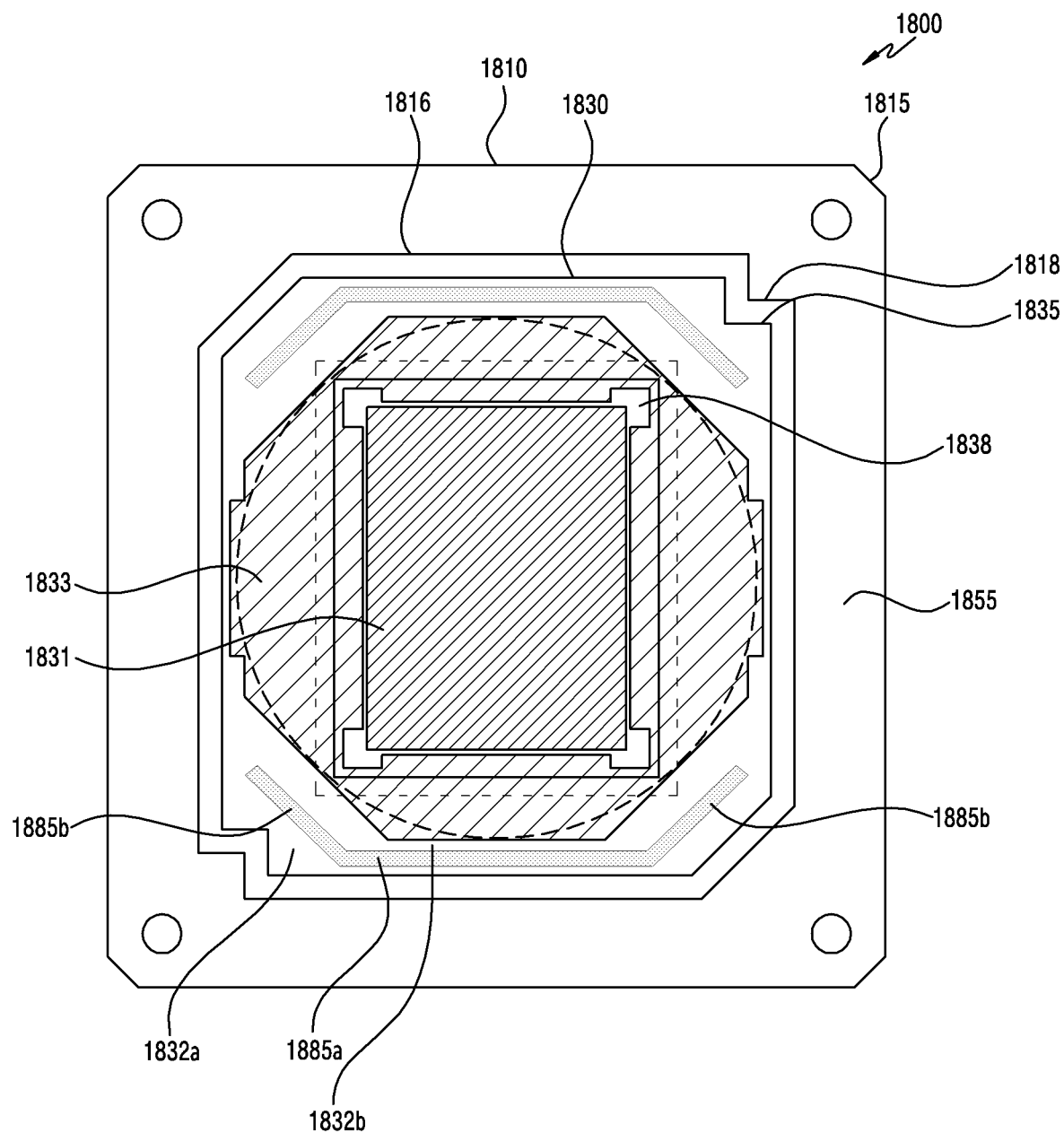

FIGS. 18A, 18B, and 18C illustrate various types of infrared filters and seating grooves in a camera module according to an embodiment.

Referring to FIGS. 18A to 18C, the camera module 1800 may include an infrared filter 1830. The infrared filter 1830 according to an embodiment includes an effective filtering region 1831, a masking region 1833, and attachment regions 1832a and 1832b. The attachment regions may include a central region 1832b and chamfered regions 1832a.

An adhesive 1885 may be disposed parallel to the edges of the infrared filter in the central region 1832b of the attachment regions, and may be bent in the chamfered regions 1832a to extend a predetermined length. In the central region 1832b in which the adhesive 1885 is disposed, an attachment region of a distance D7, which is about twice the width of the adhesive 1885, may be secured. The shortest distance D8 in the chamfered regions 1832a may be longer than the distance D7.

According to an embodiment, the attachment regions 1832a and 1832b of the infrared filter 1830 may be formed in various shapes, as long as the distance D8 can be secured. The infrared filter 1830 and the seating groove 1816 may be spaced apart from each other, and the shapes of the corner regions 1835 of the infrared filter 1830 and the corner regions 1818 of the seating groove 1816 may be arranged in a multi-stage bent shape as illustrated in FIG. 18A, may be arranged in a chamfered shape as illustrated in FIG. 18B, or may be arranged such that some edges are arranged in a multi-stage bent shape and remaining edges are arranged in a chamfered shape as illustrated in FIG. 18C.

According to various embodiments, the corner regions 1835 of the infrared filter 1830 and the corner regions 1818 of the seating groove 1816 may have a shape of a protruding curve, a curve having a recessed center, or the like.

Figure 19A:
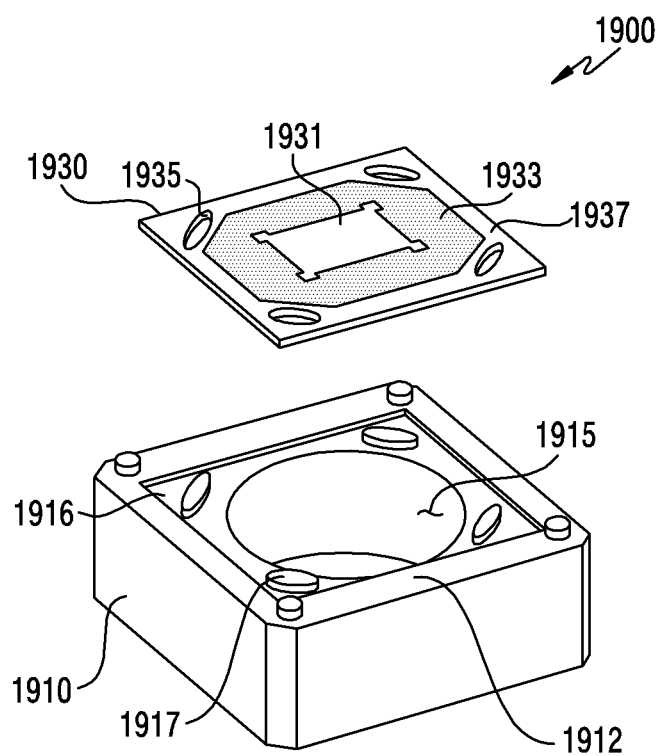
FIGS. 19A and 19B are views each illustrating a coupling relationship between an infrared filter and a housing according to an embodiment.
Figure 19B:
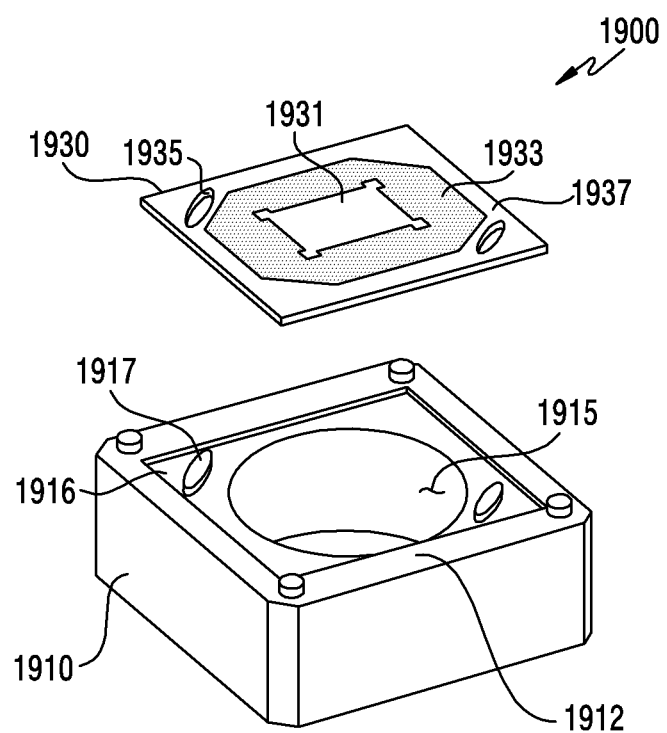

Each of FIGS. 19A and 19B illustrates a coupling relationship between an infrared filter and a housing according to an embodiment.

Referring to FIGS. 19A and 19B, a camera module 1900 may include an infrared filter 1930 and a housing 1910. The seating groove 1916 in the housing 1910 may include a protrusion 1917. According to an embodiment, the infrared filter 1930 may include an effective filtering region 1931, a masking region 1933, and an attachment region 1937, and the attachment region 1937 may have a coupling hole 1935. The infrared filter 1930 may be coupled to the housing 1910 by inserting the protrusion 1917 into the coupling hole 1935.

According to an embodiment, one or more coupling holes 1935 and protrusions 1917 may be formed in various positions, and the shape of the seating groove 1916 may be variously formed.

Each of FIGS. 20A, 20B, 20C, and 20D illustrates an infrared filter attached to a seating groove of a housing according to an embodiment.

Figure 20A:
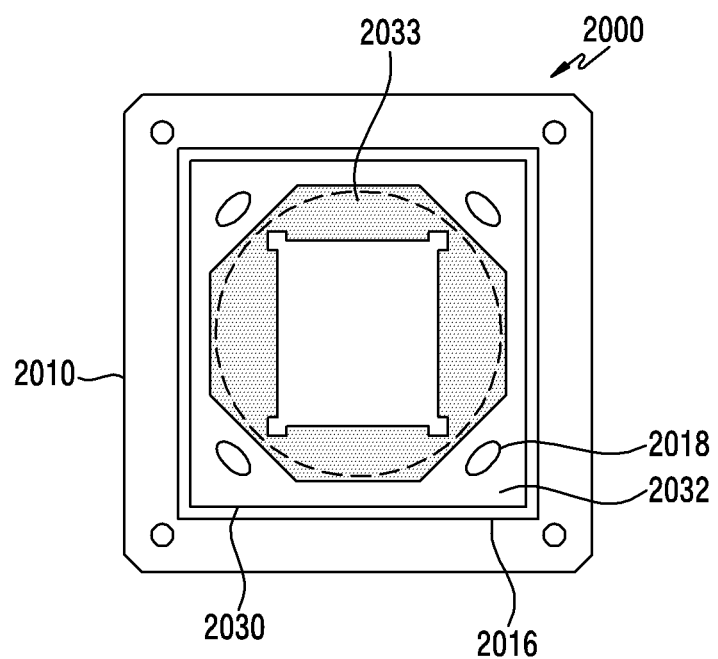
FIGS. 20A, 20B, 20C, and 20D are views each illustrating an infrared filter attached to a seating groove in a housing according to various embodiments.

Referring to FIG. 20A, as described above in FIGS. 19A and 19B, the housing 2010 of the camera module 2000 may include a seating groove 2016. The infrared filter 2030 may be disposed in the seating groove 2016 to be spaced apart from the inner wall of the seating groove 2016. The infrared filter 2030 may be coupled to the protrusions formed in the seating groove 2016 in the housing 2010 via the coupling holes 2018 formed in the attachment region 2032 of the infrared filter 2030.

Figure 20B:
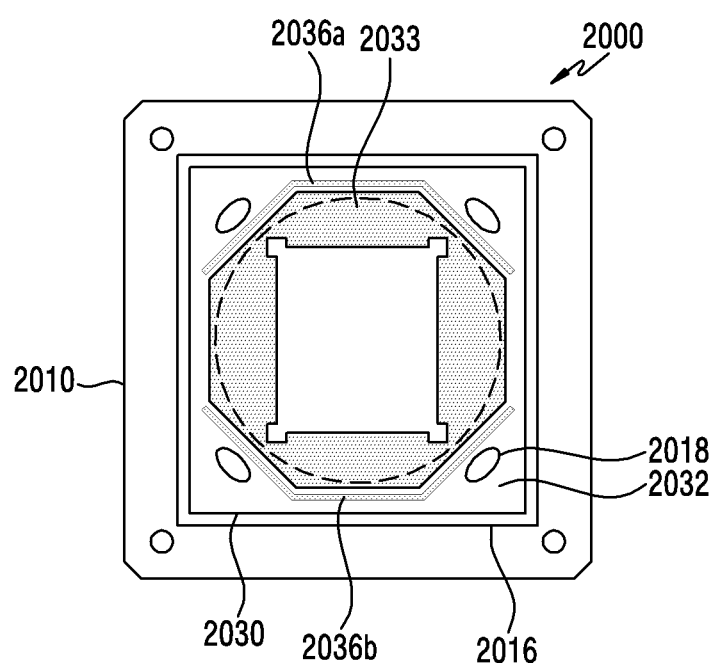
Figure 20C:
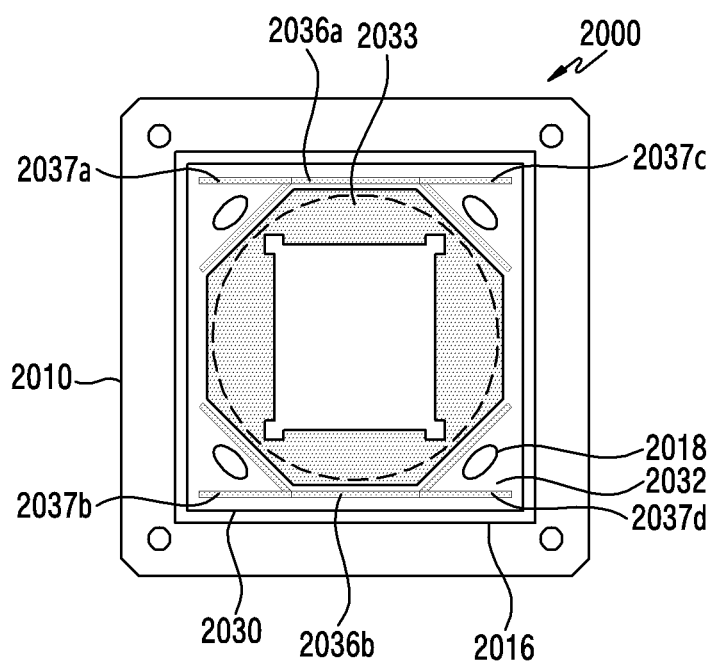
Figure 20D:
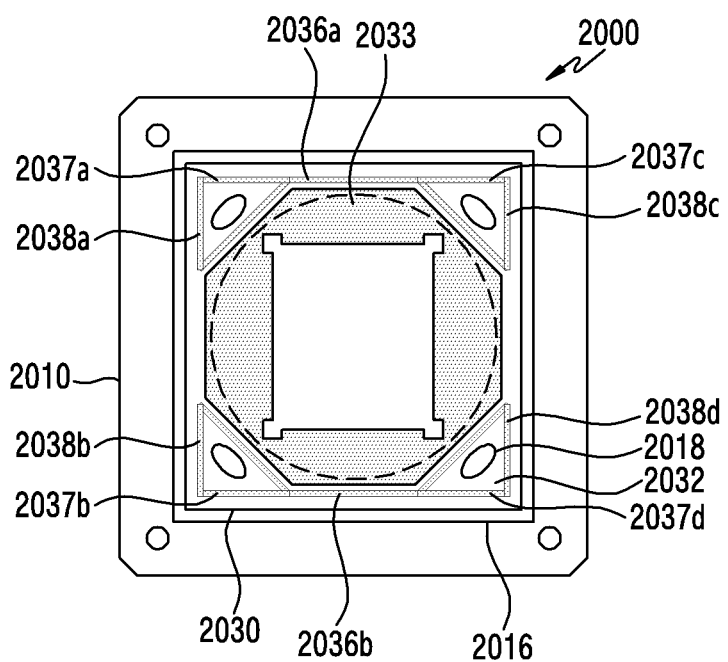

Referring to FIGS. 20B, 20C, and 20D, the bonding strength may be increased by applying bonding members around the coupling holes 2018. Two first bonding members 2036a and 2036b formed along the outer periphery of the masking region 2033 may be applied to the seating groove 2016. In addition, second bonding members 2037a, 2037b, 2037c, and 2037d extending along the edges of the infrared filter 2030 at the bent portions of the first bonding members 2036a and 2036b may be applied to the seating groove 2016. According to various embodiments, third bonding members 2038a, 2038b, 2038c, and 2038d connecting the ends of the first bonding members 2036a, and 2036b and the ends of the second bonding members 2037a, 2037b, 2037c, and 2037d may be included.

Figure 21A:
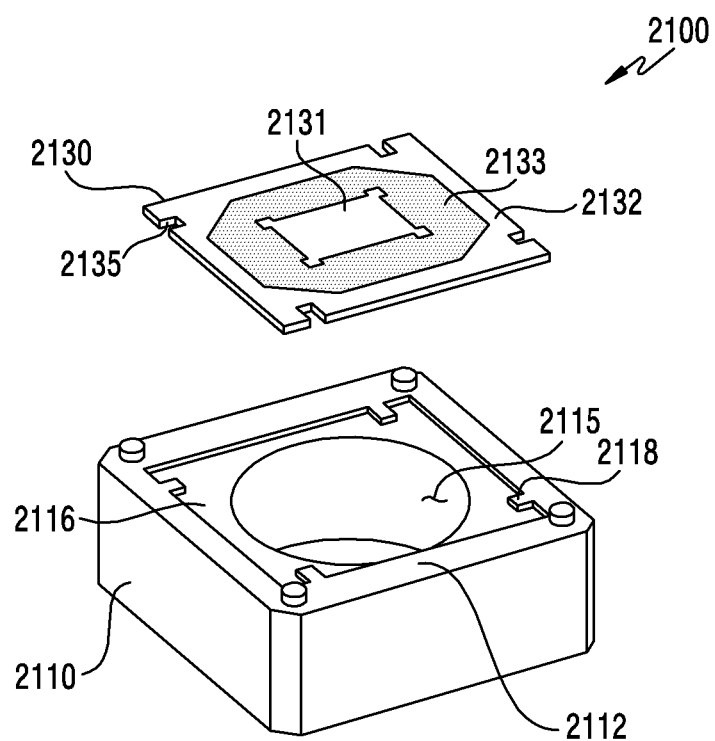
FIGS. 21A, 21B, and 21C are views each illustrating an infrared filter attached to a seating groove in a housing according to various embodiments.
Figure 21B:
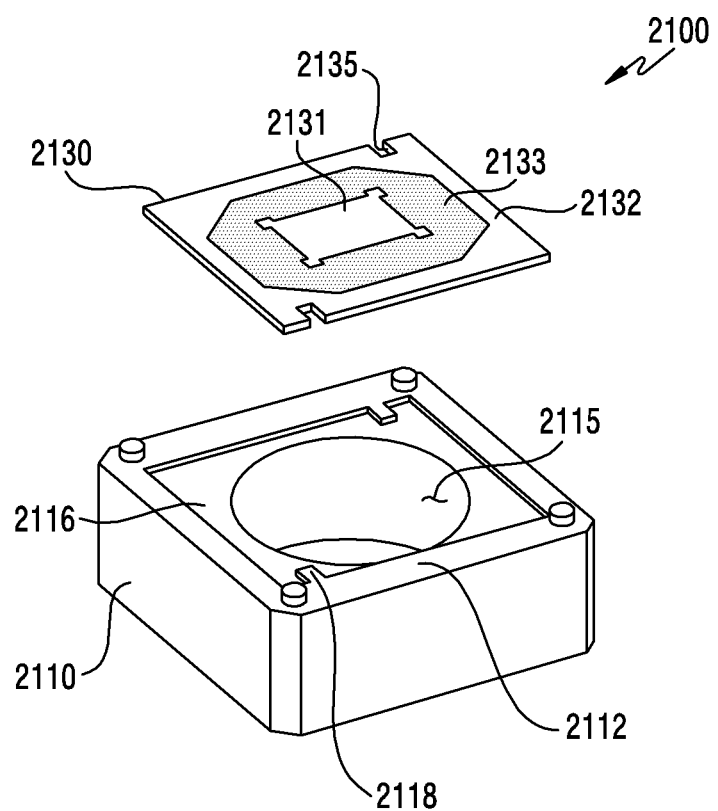
Figure 21C:
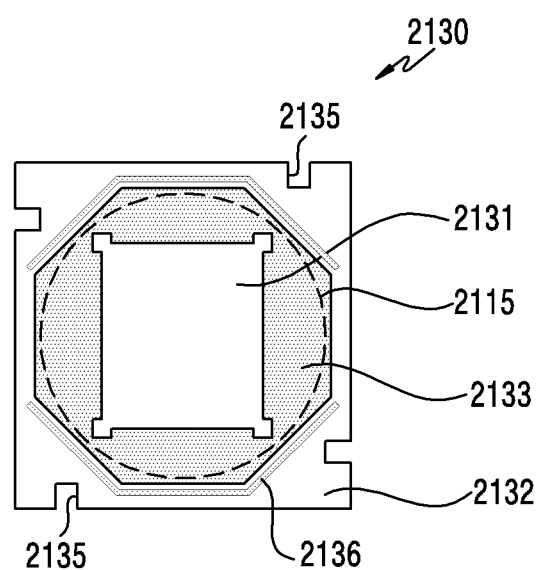

Each of FIGS. 21A, 21B, and 21C illustrates an infrared filter attached to a seating groove in a housing according to an embodiment.

Referring to FIGS. 21A and 21B, a camera module 2100 may include an infrared filter 2130 and a housing 2110. The infrared filter 2130 may include an effective filtering region 2131, a masking region 2133, and an attachment region 2132. The attachment region 2132 may include coupling grooves 2135 one or more pairs of opposite edges. The housing 2110 may include a seating groove 2116 formed around a through hole 2115, and may include protrusions 2118 protruding from the coupling region 2112 to be coupled with the printed circuit board, and corresponding to the coupling grooves 2135.

According to an embodiment, the infrared filter 2130 may be disposed in the seating groove 2116, and may be fixed when the coupling grooves 2135 and the protrusions 2118 are engaged with each other.

Referring to FIG. 21C, bonding members 2136 may be additionally applied to the infrared filter 2130. The bonding members 2136 may be applied along the masking region 2133, and when the bonding members 2136 are additionally applied to the attachment region 2132, it is possible to enhance the bonding strength between the infrared filter 2130 and the housing 2110.

Figure 22A:
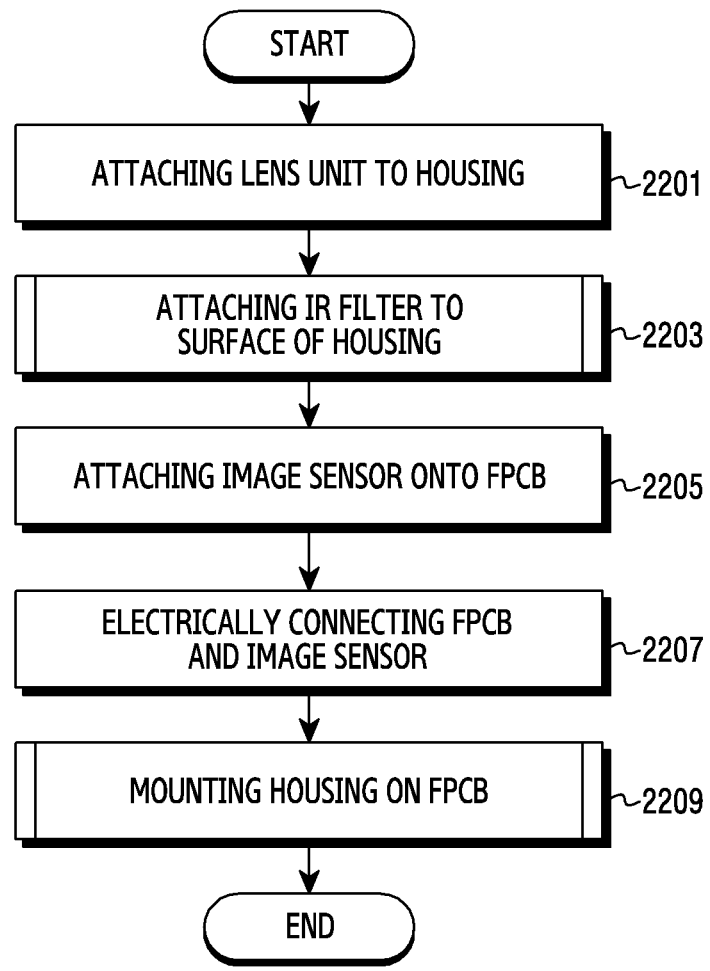
FIGS. 22A, 22B, and 22C are views each illustrating a process of manufacturing a camera module.
Figure 22B:
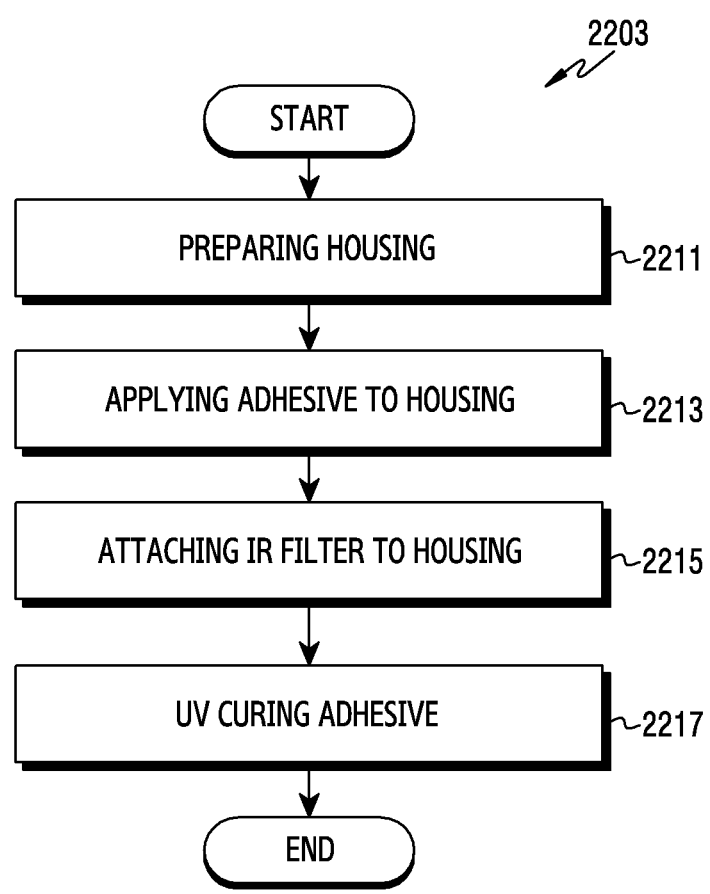
Figure 22C:
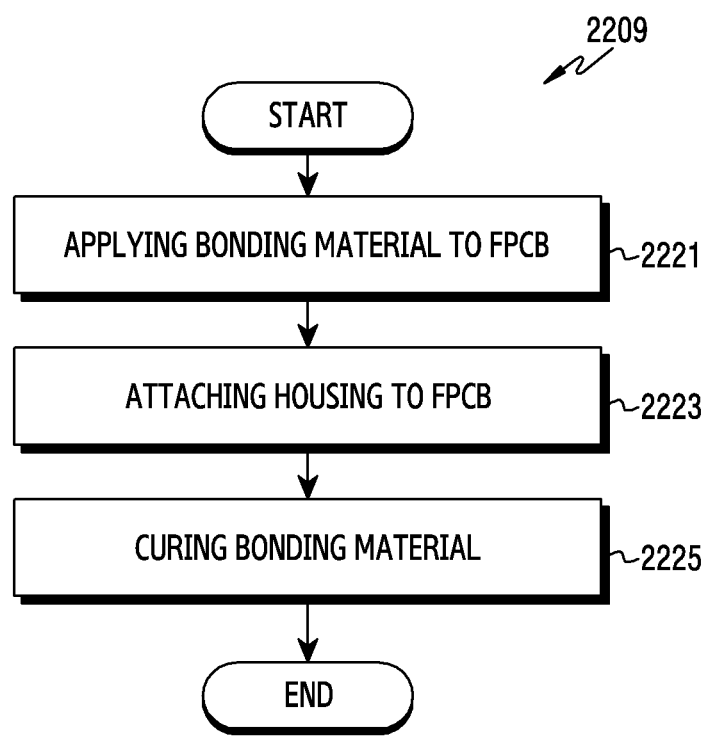

Each of FIGS. 22A, 22B, and 22C illustrates a process of manufacturing a camera module.

Referring to FIG. 22A, in operation 2201, a lens unit (e.g., the lens assembly 420 in FIG. 4B) may be attached to a housing (e.g., the housing 410 in FIG. 4A). The lens unit may be seated in a through hole (the through hole 415 in FIG. 4B) in the housing.

In operation 2203, an infrared filter may be attached to the surface of the housing. The infrared filter (e.g., the infrared filter 430 in FIG. 4B) may be attached to a surface (e.g., the second surface 412 in FIG. 4B) through which light that is incident and passes through the through hole is emitted.

In operation 2205, an image sensor (e.g., the image sensor 440 in FIG. 4B) may be attached to a flexible printed circuit board (e.g., the printed circuit board 450 in FIG. 4B). In operation 2207, the image sensor and the flexible printed circuit board may be electrically connected via a bonding wire.

In operation 2209, the housing may be mounted on the flexible printed circuit board. A protrusion of the housing may be fastened to a coupling groove in the flexible printed circuit board.

Referring to FIG. 22B, operation 2203 of attaching the infrared filter to the housing is illustrated in detail. In operation 2211, a second surface (the second surface 412 in FIG. 4B) of the housing may be prepared for working. In operation 2213, an adhesive (e.g., the adhesive 435 in FIG. 4B) may be applied to the second surface of the housing. In operation 2215, the infrared filter (e.g., the infrared filter 430 in FIG. 4B) may be attached to the housing, and in operation 2217, the adhesive can be cured with ultraviolet rays passing through the attachment region of the infrared filter (e.g., the attachment region 433 in FIG. 4B).

Referring to FIG. 22C, operation 2209 for bonding the flexible printed circuit board to the housing is illustrated in detail. In operation 2221, a bonding material may be applied to the flexible printed circuit board, and in operation 2223, the flexible circuit board may be attached by fastening the protrusion of the housing to the coupling groove in the flexible printed circuit board. In operation 2225, bonding of the flexible printed circuit board to the housing may be completed by curing the bonding material.

As described above, a camera module according to various embodiments is capable of preventing a blurring phenomenon through a combination of a housing and an infrared filter including a masking region, and is capable of enhancing the collection rate of light using a protrusion in an effective filtering region formed in a corner of the masking region, thereby preventing a flare phenomenon.

According to various embodiments, since it is possible to reduce the area of an attachment region while maintaining the bonding strength of the attachment area of the infrared filter, it is possible to reduce the size of the housing of the camera module, and thus to secure a space in which components of a printed circuit board are mounted.

As described above, a camera module according to various embodiments may include: a housing including a through hole and a lens assembly disposed in the through hole to face a first surface on which light is incident; an infrared filter attached to a second surface of the housing, positioned on a side opposite to the first surface; an image sensor configured to recognize the light passing through the infrared filter; and a printed circuit board coupled to the housing. The infrared filter may include an effective filtering region configured to transmit visible light, and a masking region surrounding the effective filtering region and having chamfered edges, the infrared filter having a shape corresponding to a shape of the chamfered edges of the masking region.

According to an embodiment, the masking area may have a polygonal shape, and the edges of the masking region may be disposed adjacent to the through hole.

According to an embodiment, when the through hole is projected onto the infrared filter, the edges of the masking region may be tangential lines of the through hole.

According to an embodiment, the effective filtering region may have a rectangular shape, and among the edges of the masking region, edges parallel to a pair of long edges of the effective filtering region may be formed to protrude.

According to an embodiment, the infrared filter may include an attachment region surrounding the masking region, and an adhesive may be applied to the second surface to be adjacent to at least two opposite edges of the attachment area.

According to an embodiment, the housing may include, in the second surface, a seating groove to which the infrared filter is attached.

According to an embodiment, among the edges of the housing, the edges parallel to the optical axis of the lens assembly may be chamfered.

The adhesive may be applied along a marginal portion of the infrared filter, and may be bent and extend in a chamfered region of the attachment region of the infrared filter.

The camera module may further include a printed circuit board including a seating groove in which the image sensor is mounted and a first coupling region formed around the seating groove to be coupled with the housing.

According to an embodiment, the housing may include, around the infrared filter, a second coupling region to be coupled with the printed circuit board.

According to an embodiment, a corner region of the first coupling region may include a coupling groove, and a corner region of the second coupling region may include a protrusion corresponding to the coupling groove.

According to an embodiment, a bonding layer may be disposed between the first coupling region and the second coupling region.

According to an embodiment, a surface of the first coupling region or the second coupling region may have irregularities.

According to various embodiments, an electronic device, which includes an inner space, may include a main printed circuit board disposed in the inner space, and a camera module connected to the main printed circuit board. The camera module may include: a housing disposed in the inner space and including a first opening, a second opening formed in a surface opposite a surface in which the first opening is disposed, and an accommodation portion formed as a hole penetrating the first and second openings; a lens assembly disposed in the accommodation portion and exposed to an outside of the electronic device through the first opening such that external light is incident on the lens assembly; an infrared filter attached to a seating groove formed in the surface in which the second opening is formed; an image sensor configured to recognize light passing through the infrared filter and having a rectangular shape; and a printed circuit board on which the image sensor is mounted, the printed circuit being coupled to the housing. The infrared filter may include an effective filtering region configured to transmit visible light, and a masking region surrounding the effective filtering region and having chamfered edges. The infrared filter may have a shape corresponding to a shape of the chamfered edges of the masking region.

According to an embodiment, the infrared filter may include an attachment region formed at a marginal portion of the masking region, and the attachment region may be formed of a transparent member, and the adhesive applied to the seating groove may be cured with ultraviolet rays passing through the attachment region so as to couple the infrared filter with the housing.

According to an embodiment, the image sensor and the printed circuit board may be electrically connected via a bonding wire.

According to an embodiment, the infrared filter may include an edge chamfered to correspond to a shape of the masking region, and the seating groove may include an edge chamfered to correspond to a shape of the infrared filter.

According to an embodiment, the shortest distance from the chamfered edge of the attachment region to the chamfered edge of the housing may be determined based on a distance from a vertex of the image sensor to the chamfered edge of the masking region.

According to an embodiment, the adhesive may be applied according to the shape of the attachment region.

According to an embodiment, the electronic device may further include a coupling region formed along a marginal portion of the seating grove, and the housing may be coupled with the printed circuit board by a bonding layer applied to the coupling region.

In the above-described specific embodiments of the disclosure, components included in the disclosure have been expressed in singular or plural terms according to the presented specific embodiments. However, the singular or plural terms are selected appropriately for the situation presented for convenience of description, and the disclosure is not limited to singular or plural constituent elements. A constituent element expressed using plural terms may be configured as a single element, or a constituent element expressed using a singular term may be configured as multiple elements.

Meanwhile, in the detailed description of the disclosure, specific embodiments have been described, but various modifications are possible without departing from the scope of the disclosure. Therefore, the scope of the disclosure should not be limited to the described embodiments, but should be determined not only based on the claims described below, but also based equivalents to the claims.

The invention claimed is:

1. A camera module comprising:
  a housing including a through hole and a lens assembly disposed in the through hole to face a first surface on which light is incident;
  an infrared filter attached to a second surface of the housing, positioned on a side opposite to the first surface;
  an image sensor configured to recognize the light passing through the infrared filter; and
  a printed circuit board coupled to the housing,
  wherein the infrared filter includes an effective filtering region configured to transmit visible light, and a masking region surrounding the effective filtering region and having chamfered edges, the infrared filter having a shape corresponding to a shape of the chamfered edges of the masking region, and
  wherein the effective filtering region includes a central region having central edges defined by the masking region and a corner region having one or more corner edges protruding outward from the central edge into the masking region.

2. The camera module of claim 1, wherein:
  the masking region has a polygonal shape, and
  the edges of the masking region are disposed adjacent to the through hole.

3. The camera module of claim 2, wherein:
  the effective filtering region has a rectangular shape, and
  among edges of the masking region, edges parallel to a pair of long edges of the effective filtering region are formed to protrude.

4. The camera module of claim 2, wherein the edges of the masking region are disposed tangentially to the through hole.

5. The camera module of claim 1, wherein:
  the infrared filter includes an attachment region surrounding the masking region, and
  the camera module further includes an adhesive positioned on the second surface to be adjacent to at least two opposite edges of the attachment region.

6. The camera module of claim 5, wherein the adhesive is positioned along a marginal portion of the infrared filter, and is bent and extends in a chamfered region of the attachment region of the infrared filter.

7. The camera module of claim 1, wherein the housing includes, in the second surface, a seating groove to which the infrared filter is attached.

8. The camera module of claim 7, wherein among the edges of the housing, edges parallel to an optical axis of the lens assembly are chamfered.

9. The camera module of claim 1, further comprising:
  a printed circuit board including:
    a seating groove in which the image sensor is mounted, and
    a first coupling region formed around the seating groove to be coupled with the housing.

10. The camera module of claim 9, wherein the housing includes:
  a second coupling region, around the infrared filter, to be coupled with the printed circuit board.

11. The camera module of claim 10, wherein a surface of the first coupling region or the second coupling region has irregularities.

12. The camera module of claim 10, wherein:
  a corner region of the first coupling region includes a coupling groove, and
  a corner region of the second coupling region includes a protrusion corresponding to the coupling groove.

13. The camera module of claim 12, further comprising a bonding layer disposed between the first coupling region and the second coupling region.

14. An electronic device including an inner space, the electronic device comprising:
  a main printed circuit board disposed in the inner space; and
  a camera module connected to the main printed circuit board,
  wherein the camera module comprises:
    a housing disposed in the inner space and including a first opening, a second opening formed in a surface opposite a surface in which the first opening is disposed, and an accommodation portion formed as a hole penetrating the first and second openings;

a lens assembly disposed in the accommodation portion and exposed to an outside of the electronic device through the first opening such that external light is incident on the lens assembly;

an infrared filter attached to a seating groove formed in the surface in which the second opening is formed;

an image sensor configured to recognize light passing through the infrared filter and having a rectangular shape; and a printed circuit board on which the image sensor is mounted, the printed circuit board being coupled to the housing, wherein the infrared filter includes an effective filtering region configured to transmit visible light, and a masking region surrounding the effective filtering region and having chamfered edges, the infrared filter having a shape corresponding to a shape of the chamfered edges of the masking region, and wherein the effective filtering region includes a central region having central edges defined by the masking region and a corner region having one or more corner edges protruding outward from the central edge into the masking region.

15. The electronic device of claim 14, wherein:

the infrared filter includes an attachment region formed at a marginal portion of the masking region, the attachment region is formed of a transparent member, and an adhesive applied to the seating groove is cured by ultraviolet rays passing through the attachment region so as to couple the infrared filter with the housing.

16. The electronic device of claim 15, wherein a shortest distance from a chamfered edge of the attachment region to a chamfered edge of the housing is a distance from a vertex of the image sensor to a chamfered edge of the masking region.

17. The electronic device of claim 16, further comprising:

a coupling region formed along a marginal portion of the seating groove, wherein the housing is coupled with the printed circuit board by a bonding layer applied to the coupling region.

18. The electronic device of claim 16, wherein the adhesive is applied positioned along a shape of the attachment region.

19. The electronic device of claim 14, wherein:

the infrared filter includes an edge chamfered to correspond to the shape of the masking region, and the seating groove includes an edge chamfered to correspond to the shape of the infrared filter.

20. The electronic device of claim 14, wherein the image sensor and the printed circuit board are electrically connected via a bonding wire.

* * * * *